US012526923B2

United States Patent
Kapoor et al.

(10) Patent No.: US 12,526,923 B2
(45) Date of Patent: Jan. 13, 2026

(54) SELECTED REJECT BAND NON-RADIOFREQUENCY-COUPLING TILE AND ASSOCIATED METHODS AND SYSTEMS

(71) Applicant: Lam Research Corporation, Fremont, CA (US)

(72) Inventors: Sunil Kapoor, Vancouver, WA (US); Eric Madsen, Sherwood, OR (US); Dan Marohl, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 414 days.

(21) Appl. No.: 18/017,381

(22) PCT Filed: Aug. 4, 2021

(86) PCT No.: PCT/US2021/044551
§ 371 (c)(1),
(2) Date: Jan. 20, 2023

(87) PCT Pub. No.: WO2022/031854
PCT Pub. Date: Feb. 10, 2022

(65) Prior Publication Data
US 2023/0262898 A1    Aug. 17, 2023

Related U.S. Application Data

(60) Provisional application No. 63/061,593, filed on Aug. 5, 2020.

(51) Int. Cl.
*H05K 1/16*    (2006.01)
*H01F 27/28*   (2006.01)
(Continued)

(52) U.S. Cl.
CPC ......... *H05K 1/165* (2013.01); *H01F 27/2804* (2013.01); *H05K 1/0218* (2013.01); *H05K 1/0233* (2013.01); *H05K 1/115* (2013.01)

(58) Field of Classification Search
CPC .... H05K 1/165; H05K 1/0218; H05K 1/0233; H05K 1/115; H02K 2201/0999; H01J 37/32174; H01F 27/2804
See application file for complete search history.

(56) References Cited

U.S. PATENT DOCUMENTS 5,373,112 A * 12/1994 Kamimura ............. H05K 1/165
  336/200
6,175,727 B1 * 1/2001 Mostov ................ H03H 7/1775
  336/200

(Continued)

FOREIGN PATENT DOCUMENTS

JP    2018-037281 A    3/2018
KR    10-2000-0054992   9/2000

OTHER PUBLICATIONS

PCT Application No. PCT/US2021/044551, International Search Report and Written Opinion, mailed on Nov. 19, 2021, 9 pages.

*Primary Examiner* — Timothy J Thompson
*Assistant Examiner* — Amol H Patel
(74) *Attorney, Agent, or Firm* — Penilla IP, APC

(57) ABSTRACT

A selected reject band non-RF-coupling tile includes a ground plate disposed on a first side of a printed circuit board. The selected reject band non-RF-coupling tile also includes a planar inductor disposed on a second side of the printed circuit board. The selected reject band non-RF-coupling tile also includes a conductive via structure extending through the printed circuit board. The conductive via structure electrically connects to both the ground plate and the planar inductor at a location near an interior end of the planar inductor. The selected reject band non-RF-coupling (Continued)

tile is used to shield enclosure walls and/or other electrical circuitry from RF fields. The selected reject band non-RF-coupling tile is also used to encapsulate an RF carrying component to block RF fields that emanate from the RF carrying component.

19 Claims, 22 Drawing Sheets

(51) Int. Cl.
*H05K 1/02* (2006.01)
*H05K 1/11* (2006.01)

(56) References Cited

U.S. PATENT DOCUMENTS

| | | | |
|---|---|---|---|
| 6,714,113 B1* | 3/2004 | Abadeer | H01L 23/5227 |
| | | | 336/200 |
| 2004/0119658 A1* | 6/2004 | Waltho | H01Q 1/243 |
| | | | 343/909 |
| 2014/0210337 A1 | 7/2014 | Setsuhara et al. | |
| 2018/0096777 A1* | 4/2018 | Akcasu | H01G 4/40 |
| 2020/0186202 A1 | 6/2020 | Baldwin et al. | |
| 2022/0221350 A1* | 7/2022 | Lynch | H05K 1/162 |

* cited by examiner (View A-A)

(View B-B)

(View C-C)

Insertion Loss

701

Having a non-RF-coupling tile that includes a ground plate on a first side of a printed circuit board and a planar inductor on a second side of the printed circuit board, with a conductive via structure extending through the printed circuit board to electrically connect the ground plate to the planar inductor at a location near an interior end of the planar inductor.

703

Disposing the non-RF-coupling tile on an interior side of an enclosure wall such that the ground plate of the non-RF-coupling tile is in physical and electrical contact with the enclosure wall.

Fig. 7

(View A-A)

(View B-B)

SELECTED REJECT BAND NON-RADIOFREQUENCY-COUPLING TILE AND ASSOCIATED METHODS AND SYSTEMS

This application is a national stage filing of and claims priority, under 35 U.S.C. § 371, to PCT/US2021/044551, filed on Aug. 4, 2021, which claims the benefit of U.S. Provisional Application No. 63/061,593, filed on Aug. 5, 2020. The entire disclosure of each application referenced above is incorporated herein by reference.

BACKGROUND

Many industrial systems use radiofrequency (RF) power for various purposes. For example, the semiconductor fabrication industry uses RF power to generate plasmas for various purposes, such as for etching of materials from semiconductor wafers, depositing materials on semiconductor wafers, and cleaning materials from semiconductor wafers, among other things. The components that carry RF power often need to be enclosed in electrically grounded structures to prevent associated RF fields from interfering with other neighboring electrical systems. FIG. 1 shows an example enclosure 101 that includes an interior region in which a configuration of RF circuitry 103 is installed. The walls of the enclosure 101 are electrically grounded. If the RF circuitry 103 is positioned too close to the walls of the enclosure 101, the RF fields emanating from the RF circuitry 103 will couple to the walls of the enclosure 101, thereby causing a loss/waste of RF power and parasitic effects through the RF circuitry 103 which can affect performance of downstream RF devices. Therefore, the RF circuitry 103 has to be positioned a minimum distance 102 away from the walls of the enclosure to avoid adverse coupling of RF power from the RF circuitry 103 to the walls of the enclosure 101. Unfortunately, the minimum distance 102 required to avoid unwanted RF coupling to the walls of the enclosure 101 is rather large and requires the enclosure 101 to be correspondingly enlarged, which is not always possible, especially within the confines of a semiconductor fabrication facility. Moreover, at higher RF power, the minimum distance 102 increases and the corresponding size of the enclosure 101 increases. However, it is often not possible to increase the size of the enclosure 101 as needed to achieve the minimum separation distance 102 between the RF circuitry and the walls of the enclosure 101. Therefore, due to size limitations, many systems must absorb the loss/waste of RF power and manage the parasitic complications due to unwanted and unavoidable coupling of RF power from the RF circuitry 103 to the walls of the enclosure 101. It is within this context that the present invention arises.

SUMMARY

In an example embodiment, a selected reject band non-RF-coupling tile is disclosed. The selected reject band non-RF-coupling tile includes a ground plate disposed on a first side of a printed circuit board. The selected reject band non-RF-coupling tile also includes a planar inductor disposed on a second side of the printed circuit board. The selected reject band non-RF-coupling tile also includes a conductive via structure extending through the printed circuit board. The conductive via structure is electrically connected to the planar inductor near an interior end of the planar inductor. The conductive via structure is also electrically connected the ground plate.

In an example embodiment, a method is disclosed for making a selected reject band non-RF-coupling tile. The method includes disposing a ground plate on a first side of a printed circuit board. The method also includes forming a hole through the printed circuit board. The method also includes disposing a conductive via structure within the hole to electrically contact the ground plate. The method also includes disposing a planar inductor on a second side of the printed circuit board. The planar inductor is disposed such that the planar inductor is in electrical contact with the conductive via structure at a location near an interior end of the planar inductor.

In an example embodiment, a selected reject band non-RF-coupling enclosure is disclosed. The selected reject band non-RF-coupling enclosure includes an enclosure wall formed of electrically conductive material. The enclosure wall is electrically connected to a reference ground potential. The enclosure wall has an interior side and an exterior side. The selected reject band non-RF-coupling enclosure also includes at least one selected reject band non-RF-coupling tile disposed on the interior side of the enclosure wall. Each of the at least one selected reject band non-RF-coupling tile includes a corresponding ground plate disposed on a first side of a corresponding printed circuit board. The corresponding ground plate is positioned in physical and electrical contact with the interior side of the enclosure wall. Each of the at least one selected reject band non-RF-coupling tile also includes a corresponding planar inductor disposed on a second side of the corresponding printed circuit board. Each of the at least one selected reject band non-RF-coupling tile also includes a corresponding conductive via structure extending through the corresponding printed circuit board and electrically connecting with both the corresponding ground plate and the corresponding planar inductor near an interior end of the corresponding planar inductor.

In an example embodiment, a method is disclosed for forming a selected reject band non-RF-coupling enclosure. The method includes having a selected reject band non-RF-coupling tile that includes a ground plate disposed on a first side of a printed circuit board and a planar inductor disposed on a second side of the printed circuit board. The selected reject band non-RF-coupling tile also includes a conductive via structure that extends through the printed circuit board and electrically connects with both the ground plate and the planar inductor near an interior end of the planar inductor. The method also includes disposing the selected reject band non-RF-coupling tile on an interior side of an enclosure wall, such that the ground plate of the selected reject band non-RF-coupling tile is in physical and electrical contact with the interior side of the enclosure wall. The enclosure wall is formed of electrically conductive material. And, the enclosure wall is electrically connected to a reference ground potential.

In an example embodiment, an RF signal filter is disclosed. The RF signal filter includes a first selected reject band non-RF-coupling tile. The RF signal filter also includes a second selected reject band non-RF-coupling tile. The RF signal filter also includes a planar-shaped RF line filter disposed between the first selected reject band non-RF-coupling tile and the second selected reject band non-RF-coupling tile. The first selected reject band non-RF-coupling tile, the second selected reject band non-RF-coupling tile, and the planar-shaped RF line filter are integrally formed as a single unit.

In an example embodiment, a method is disclosed for forming an RF signal filter. The method includes having a first selected reject band non-RF-coupling tile. The method also includes having a second selected reject band non-RF-coupling tile. The method also includes disposing a planar-shaped RF line filter between the first selected reject band non-RF-coupling tile and the second selected reject band non-RF-coupling tile, such that the first selected reject band non-RF-coupling tile, the second selected reject band non-RF-coupling tile, and the planar-shaped RF line filter are integrally formed as a single unit.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 7 shows a flowchart of a method for forming a selected reject band non-RF-coupling enclosure, in accordance with some embodiments.

DETAILED DESCRIPTION

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

Figure 1:
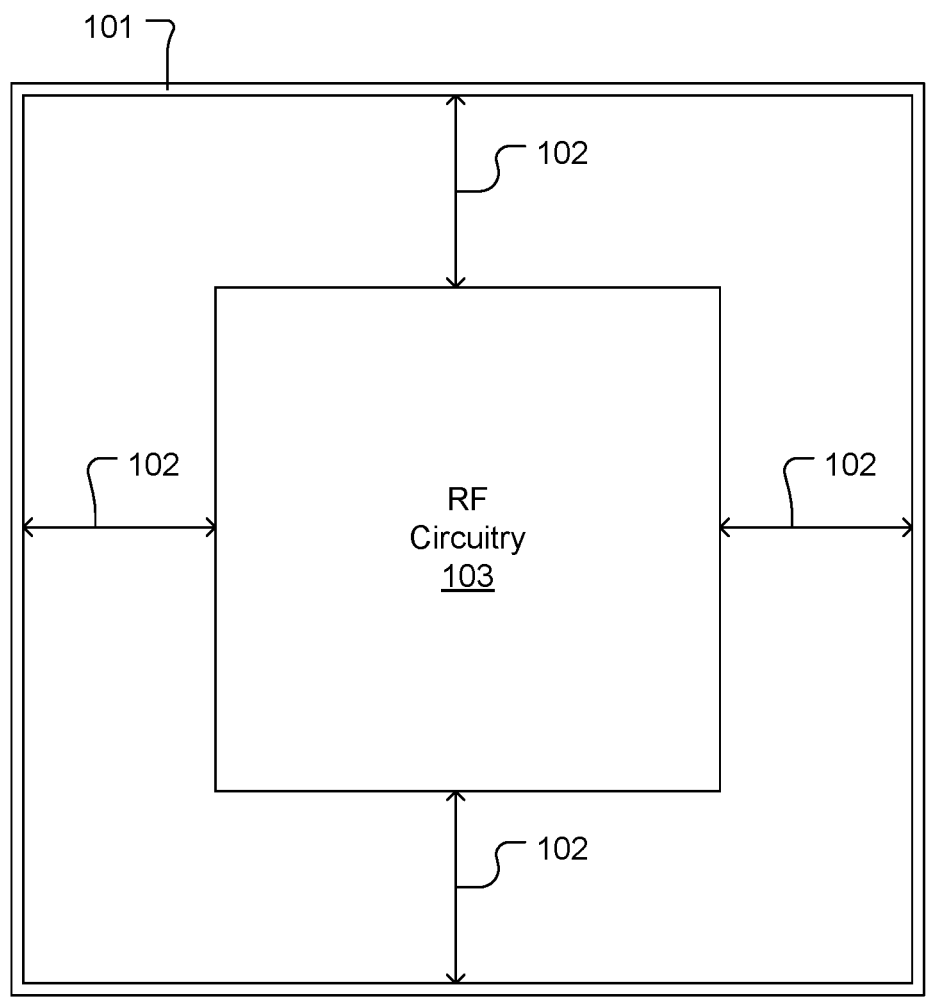
FIG. 1 shows an example enclosure that includes an interior region in which a configuration of RF circuitry is installed.
Figure 2A:
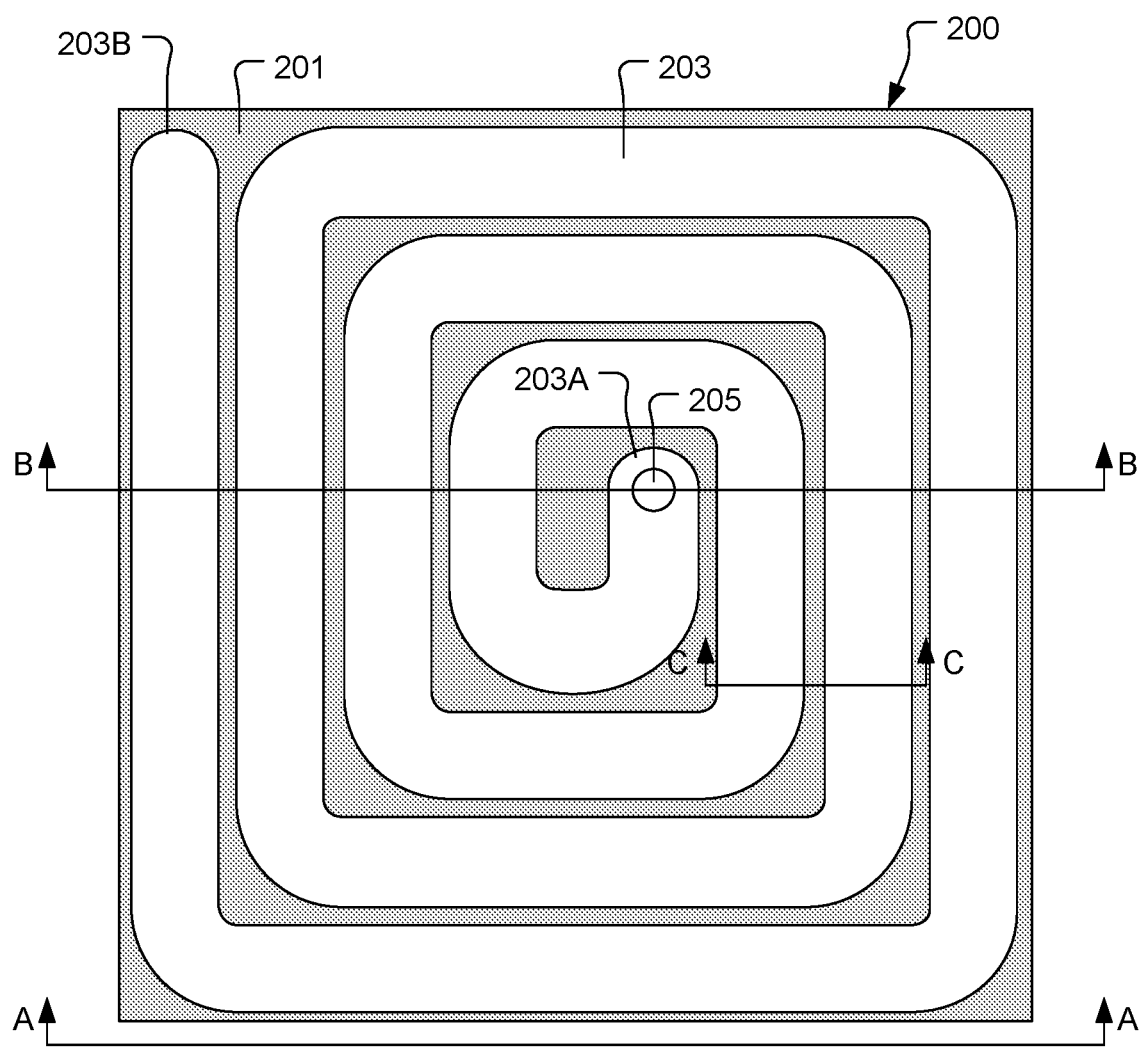
FIG. 2A shows a top view of a selected reject band non-RF-coupling tile, in accordance with some embodiments.
Figure 2B:
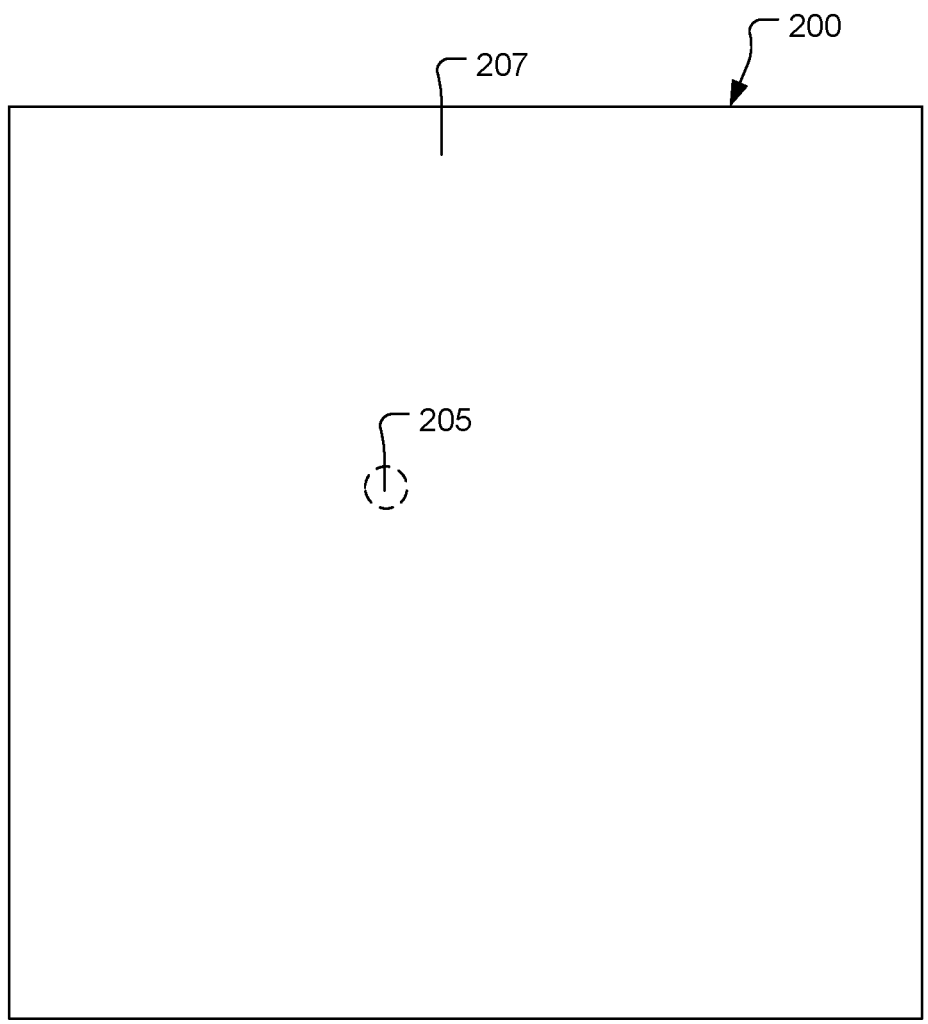
FIG. 2B shows a bottom view of the selected reject band non-RF-coupling tile, in accordance with some embodiments.

FIG. 2A shows a top view of a selected reject band non-radiofrequency-coupling tile (selected reject band non- RF-coupling tile) 200, in accordance with some embodiments. FIG. 2B shows a bottom view of the selected reject band non-RF-coupling tile 200, in accordance with some embodiments. The selected reject band non-RF-coupling tile 200 is also referred to as an RF band reject filter. The selected reject band non-RF-coupling tile 200 includes a ground plate 207 disposed on a first side of a printed circuit board (PCB) 201. The ground plate 207 is configured to cover a bottom of the selected reject band non-RF-coupling tile 200, as shown in FIG. 2B. According to some embodiments, the ground plate 207 is exposed on the bottom of the selected reject band non-RF-coupling tile 200. The selected reject band non-RF-coupling tile 200 also includes a planar inductor 203 disposed on a second side of the PCB 201. The planar inductor 203 is configured to extend across a top surface of the selected reject band non-RF-coupling tile 200. In this manner, in some embodiments, the selected reject band non-RF-coupling tile 200 is formed as a two layer PCB 201, having the planar inductor 203 on one side of the PCB 201 and the ground plate 207 on the other side of the PCB 201. The planar inductor 203 is configured to have a spiral shape with an interior end 203A of the planar inductor 203 positioned at a center of the spiral shape and with an exterior end 203B of the planar inductor 203 positioned at an outer edge of the spiral shape. In some embodiments, the planar inductor 203 is exposed on the top surface of the selected reject band non-RF-coupling tile 200. However, in some embodiments, the planar inductor 203 is covered by a thin layer of PCB material, e.g., less than about 1 millimeter, to protect the planar inductor 203, such that the planar inductor 203 is not exposed on the top surface of the selected reject band non-RF-coupling tile 200. The selected reject band non-RF-coupling tile 200 also includes a conductive via structure 205 that extends through the PCB 201 to electrically connect to both the ground plate 207 and the planar inductor 203 near the interior end 203A of the planar inductor 203. In this manner, the interior end 203A of the planar inductor 203 is electrically connected to the ground plate 207 through the conductive via structure 205 at a location near a center of the ground plate 207 (shown in FIG. 2B).

Figure 2C:
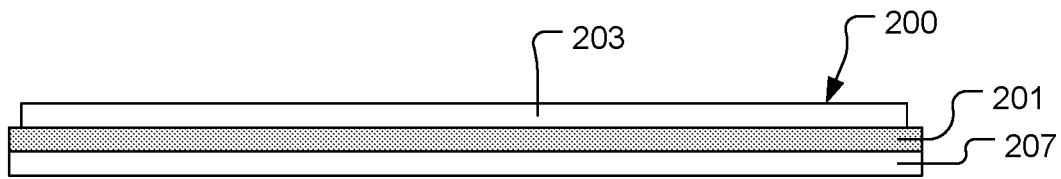
FIG. 2C shows a side view of the selected reject band non-RF-coupling tile, corresponding to View A-A as referenced in FIG. 2A, in accordance with some embodiments.
Figure 2D:
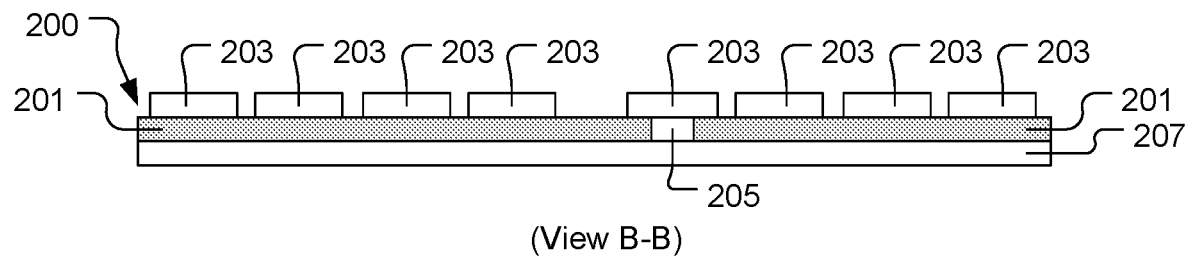
FIG. 2D shows a vertical cross-section view through the selected reject band non-RF-coupling tile, corresponding to View B-B as referenced in FIG. 2A, in accordance with some embodiments.
Figure 2E:
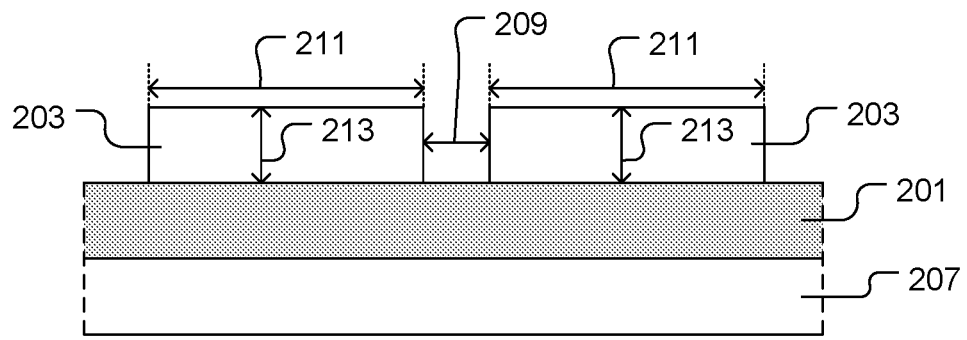
FIG. 2E shows a close-up vertical cross-section view of the planar inductor on the selected reject band non-RF-coupling tile, corresponding to View C-C as referenced in FIG. 2A, in accordance with some embodiments.
Figure 2F:
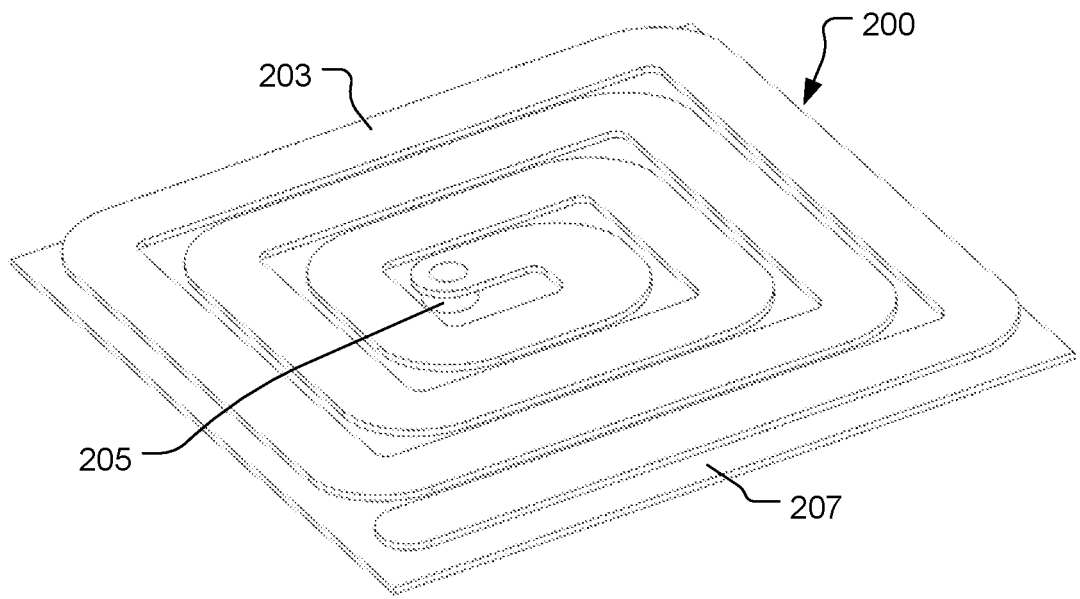
FIG. 2F shows an isometric view of the top of the selected reject band non-RF-coupling tile, with the PCB material removed for purposes of illustration, in accordance with some embodiments.

FIG. 2C shows a side view of the selected reject band non-RF-coupling tile 200, corresponding to View A-A as referenced in FIG. 2A, in accordance with some embodiments. FIG. 2D shows a vertical cross-section view through the selected reject band non-RF-coupling tile 200, corresponding to View B-B as referenced in FIG. 2A, in accordance with some embodiments. FIG. 2E shows a close-up vertical cross-section view of the planar inductor 203, corresponding to View C-C as referenced in FIG. 2A, in accordance with some embodiments. As shown in FIG. 2E, in some embodiments, the planar inductor 203 is defined by a substantially rectangular shaped vertical cross-section having a nominal width 211 as measured parallel to the PCB 201 within a range extending from about 0.1 millimeters (mm) to about 10 mm, and having a nominal height 213 as measured perpendicular to the PCB 201 within a range extending from about 0.05 mm to about 3 mm. It should be understood that the as-manufactured vertical cross-section of the planar inductor 203 may have a substantially rectangular shape, as compared to a perfectly rectangular shape, due to manufacturing capabilities. For example, the as-manufactured vertical cross-section of the planar inductor 203 can have a substantially rectangular shape with some variation in rounding at some of the corners. Also, in some embodiments, a distance 209 as measured parallel to the PCB 201 between adjacent turns of the planar inductor 203 is within a range extending from about 0.1 mm to about 5 mm. In some embodiments, a substantially uniform value of the distance 209 between adjacent turns is maintained around the spiral shape of the planar inductor 203. However, in some embodiments, the value of the distance 209 between adjacent turns varies around the spiral shape of the planar inductor 203. Also, in some embodiments, the planar inductor 203 includes a number of turns within a range extending from about 2 turns to about 50 turns. It should be understood that the number of turns of the planar inductor 203 is limited by the width 211 of the vertical cross-section of the planar inductor 203, the distance 209 between adjacent turns of the planar inductor 203, and the overall area of the PCB 201. FIG. 2F shows an isometric view of the top of the selected reject band non-RF-coupling tile 200, with the PCB 201 material removed for purposes of illustration, in accordance with some embodiments.

The planar inductor 203 is shaped and sized to prevent coupling of RF signals within a particular RF frequency band to the ground plate 207. When deployed, the selected reject band non-RF-coupling tile 200 is oriented so that the planar inductor 203 faces toward the source of the RF field that is incident upon the selected reject band non-RF-coupling tile 200. The planar inductor 203 functions to block and/or reflect back RF signals within the particular RF frequency band to prevent those RF signals from reaching the ground plate 207. The particular RF frequency band that the planar inductor is configured to block/reflect is defined to encompass an operating RF frequency that will be responsible for generating RF fields within the vicinity of the selected reject band non-RF-coupling tile 200. The planar inductor 203 is configured to have a specific interaction with the RF field so as to block/reflect the RF signals from reaching the ground plate 207.

Figure 3A:
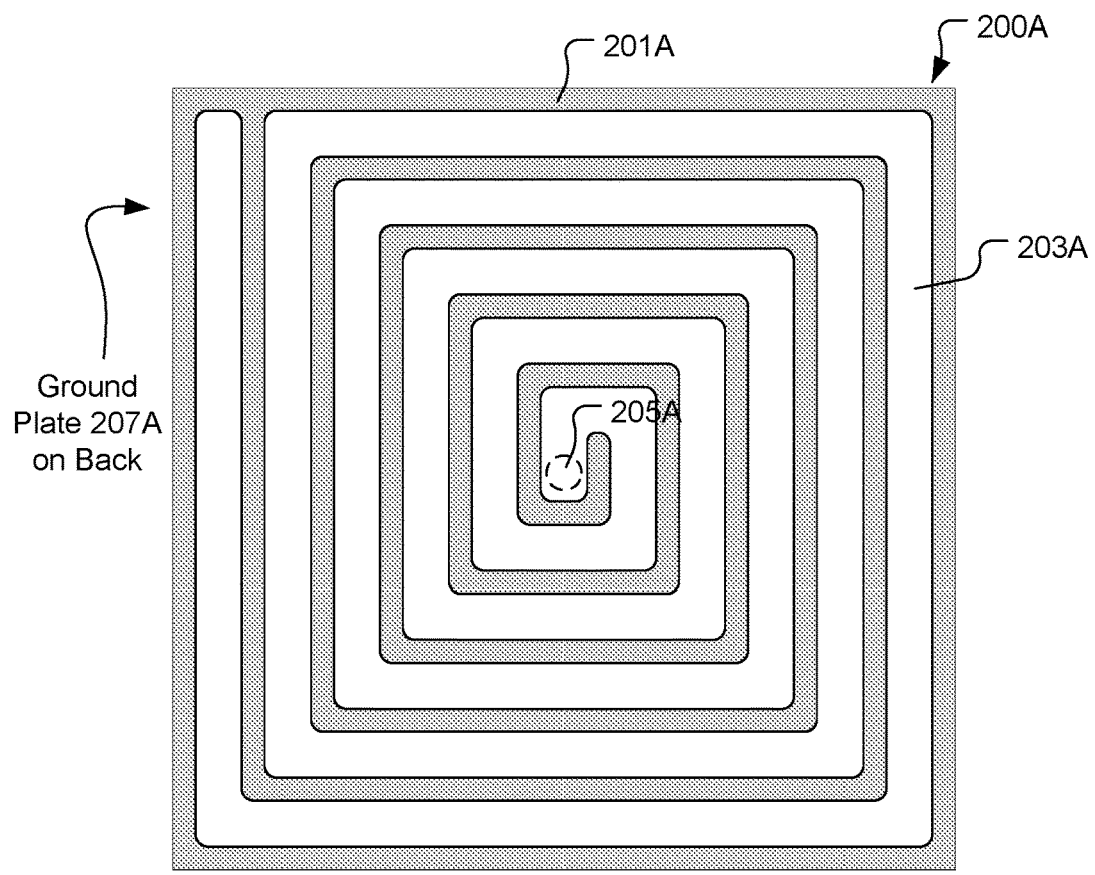
FIG. 3A shows a top view of a selected reject band non-RF-coupling tile that includes another example of a planar inductor having a square spiral shape, in accordance with some embodiments.

In some embodiments, such as shown in FIG. 2A, the planar inductor 203 has a square spiral shape. FIG. 3A shows a top view of selected reject band non-RF-coupling tile 200A that includes another example of a planar inductor 203A having a square spiral shape, in accordance with some embodiments. The planar inductor 203A is also disposed on a correspondingly square-shaped PCB 201A. It should be understood that the selected reject band non-RF-coupling tile 200A also includes a ground plate 207A and a conductive via structure 205A in the same manner as described with regard to the selected reject band non-RF-coupling tile 200 of FIG. 2A.

Figure 3B:
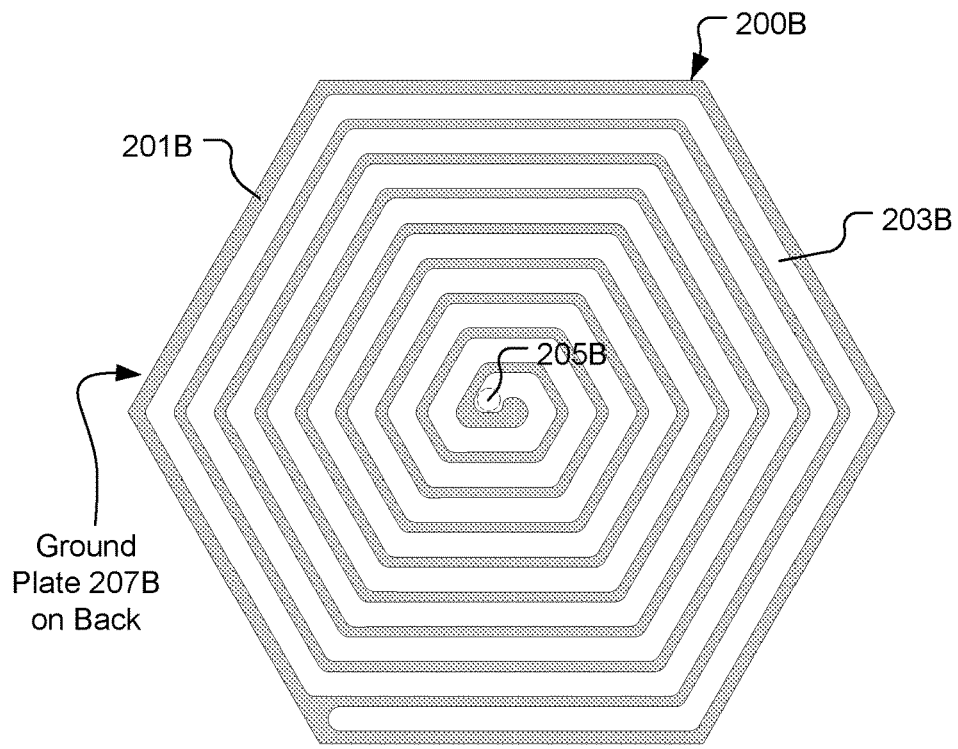
FIG. 3B shows a top view of a selected reject band non-RF-coupling tile that includes another example of a planar inductor having a hexagonal spiral shape, in accordance with some embodiments.
Figure 3C:
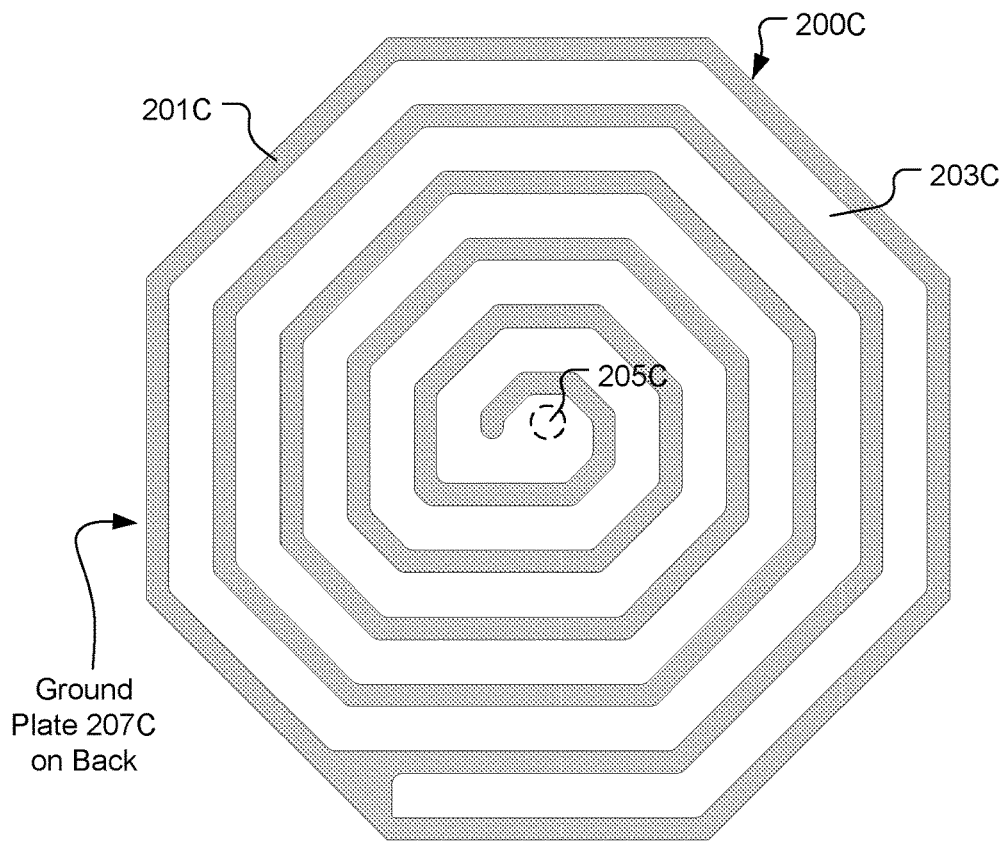
FIG. 3C shows a top view of a selected reject band non-RF-coupling tile that includes another example of a planar inductor having an octagonal spiral shape, in accordance with some embodiments.

The spiral shape of the planar inductor 203 can be different in different embodiments. For example, in various embodiments, the spiral shape of the planar inductor 203 is either a hexagonal spiral shape, an octagonal spiral shape, a circular spiral shape, a rectangular spiral shape, or a triangular spiral shape, among others. FIG. 3B shows a top view of a selected reject band non-RF-coupling tile 200B that includes another example of a planar inductor 203B having a hexagonal spiral shape, in accordance with some embodiments. The planar inductor 203B is also disposed on a correspondingly hexagonal-shaped PCB 201B. It should be understood that the selected reject band non-RF-coupling tile 200B also includes a ground plate 207B and a conductive via structure 205B in the same manner as described with regard to the selected reject band non-RF-coupling tile 200 of FIG. 2A. FIG. 3C shows a top view of a selected reject band non-RF-coupling tile 200C that includes another example of a planar inductor 203C having an octagonal spiral shape, in accordance with some embodiments. The planar inductor 203C is also disposed on a correspondingly octagonal-shaped PCB 201C. It should be understood that the selected reject band non-RF-coupling tile 200C also includes a ground plate 207C and a conductive via structure 205C in the same manner as described with regard to the selected reject band non-RF-coupling tile 200 of FIG. 2A.

Figure 3D:
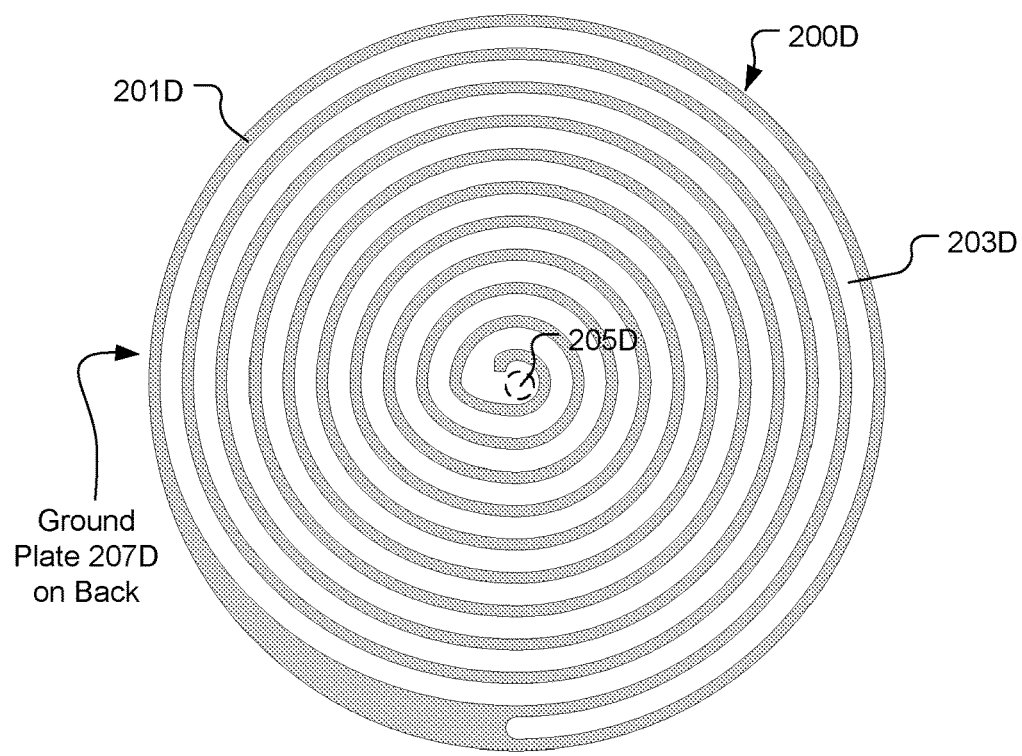
FIG. 3D shows a top view of a selected reject band non-RF-coupling tile that includes another example of a planar inductor having a circular spiral shape, in accordance with some embodiments.
Figure 3E:
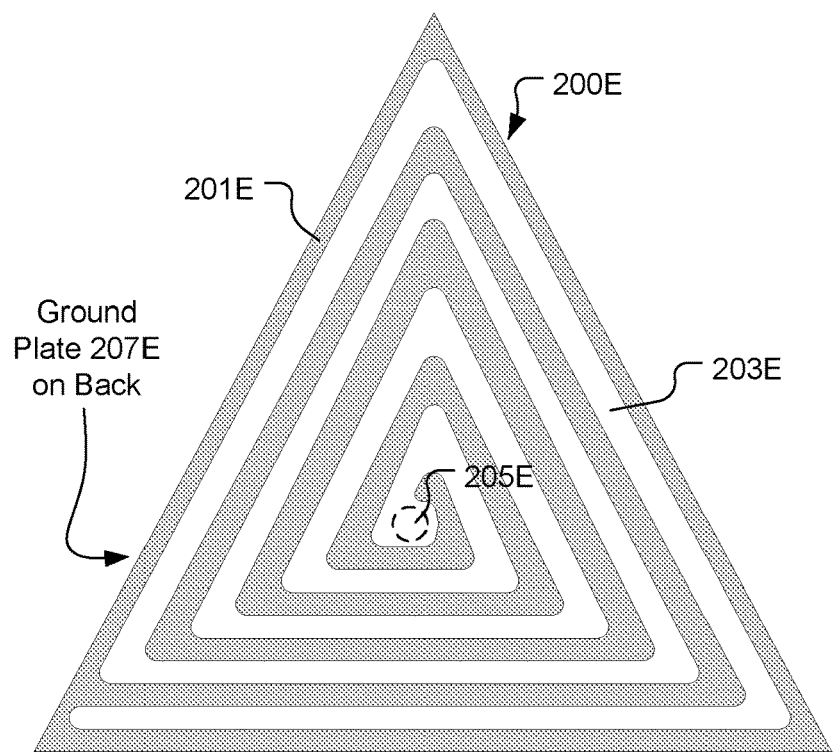
FIG. 3E shows a top view of selected reject band non-RF-coupling tile that includes another example of a planar inductor having a triangular spiral shape, in accordance with some embodiments.
Figure 3F:
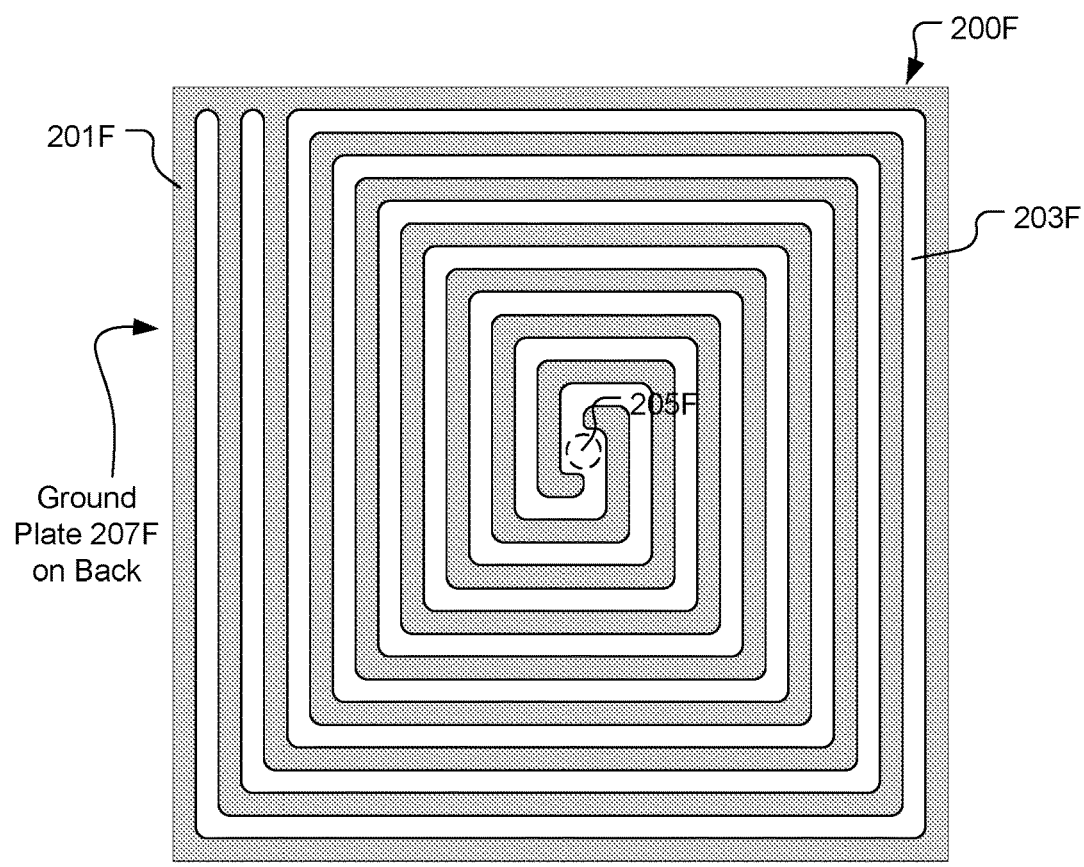
FIG. 3F shows a top view of a selected reject band non-RF-coupling tile that includes an example of a planar inductor having a square double spiral shape, in accordance with some embodiments.

FIG. 3D shows a top view of a selected reject band non-RF-coupling tile 200D that includes another example of a planar inductor 203D having a circular spiral shape, in accordance with some embodiments. The planar inductor 203D is also disposed on a correspondingly circular-shaped PCB 201D. It should be understood that the selected reject band non-RF-coupling tile 200D also includes a ground plate 207D and a conductive via structure 205D in the same manner as described with regard to the selected reject band non-RF-coupling tile 200 of FIG. 2A. FIG. 3E shows a top view of selected reject band non-RF-coupling tile 200E that includes another example of a planar inductor 203E having a triangular spiral shape, in accordance with some embodiments. The planar inductor 203E is also disposed on a correspondingly triangular-shaped PCB 201E. It should be understood that the selected reject band non-RF-coupling tile 200E also includes a ground plate 207E and a conductive via structure 205E in the same manner as described with regard to the selected reject band non-RF-coupling tile 200 of FIG. 2A. In some embodiments, any of the spiral configurations of the planar inductor 203 can be formed by a double spiral, a triple spiral, etc. For example, FIG. 3F shows a top view of a selected reject band non-RF-coupling tile 200F that includes an example of a planar inductor 203F having a square double spiral shape, in accordance with some embodiments. The planar inductor 203F is also disposed on a correspondingly square-shaped PCB 201F. It should be understood that the selected reject band non-RF-coupling tile 200F also includes a ground plate 207F and a conductive via structure 205F in the same manner as described with regard to the selected reject band non-RF-coupling tile 200 of FIG. 2A. It should be understood that the planar spiral inductor 203 can be configured in many different ways so long as the selected reject band non-RF-coupling tile 200, 200A-200F functions to prevent RF fields associated with the operating RF frequency from coupling with the ground plate 207. For ease of description, the selected reject band non-RF-coupling tile 200 is used herein to describe various embodiments. However, it should be understood that any of the selected reject band non-RF-coupling tiles 200, 200A, 200B, 200C, 200D, 200E, 200F, or variations thereof, can be used in the various embodiments disclosed herein where the selected reject band non-RF-coupling tile 200 is referenced, as appropriate.

In some embodiments, the PCB 201 is formed of a dielectric material, such as FR-4 glass epoxy by way of example, among many other possible PCB substrate materials. In some embodiments, a thickness of the PCB 201 between the planar inductor 203 and the ground plate 207 (measured perpendicularly between the planar inductor 203 and the ground plate 207) is up to about 6 mm. In some embodiments, the thickness of the PCB 201 between the planar inductor 203 and the ground plate 207 (measured perpendicularly between the planar inductor 203 and the ground plate 207) is within a range extending from about 1 millimeter to about 6 millimeters. In some embodiments, the thickness of the PCB 201 between the planar inductor 203 and the ground plate 207 (measured perpendicularly between the planar inductor 203 and the ground plate 207) is within a range extending from about 3 millimeters to about 4 millimeters. Also, in some embodiments, an area percentage of the ground plate 207 that is overlapped by the planar inductor 203 is within a range extending from about 30% to about 100%. In some embodiments, the area percentage of the ground plate 207 that is overlapped by the planar inductor 203 is within a range extending up to about 50%. The PCB 201 ensures that the spacing between the planar inductor 203 and the ground plate 207 is carefully controlled and maintained. The PCB 201 also ensures that a fixed spatial relationship is maintained between the planar inductor 203 and the ground plate 207.

In some embodiments, the ground plate 207, the planar inductor 203, and the conductive via structure 205 are formed of copper, and the PCB 201 is formed of FR-4 glass epoxy. However, in other embodiments, the ground plate 207, the planar inductor 203, and the conductive via structure 205 can be formed of another electrically conductive material that is compatible with the PCB fabrication process. Also, in other embodiments, the PCB 201 can be formed of essentially any PCB substrate material.

Figure 4:
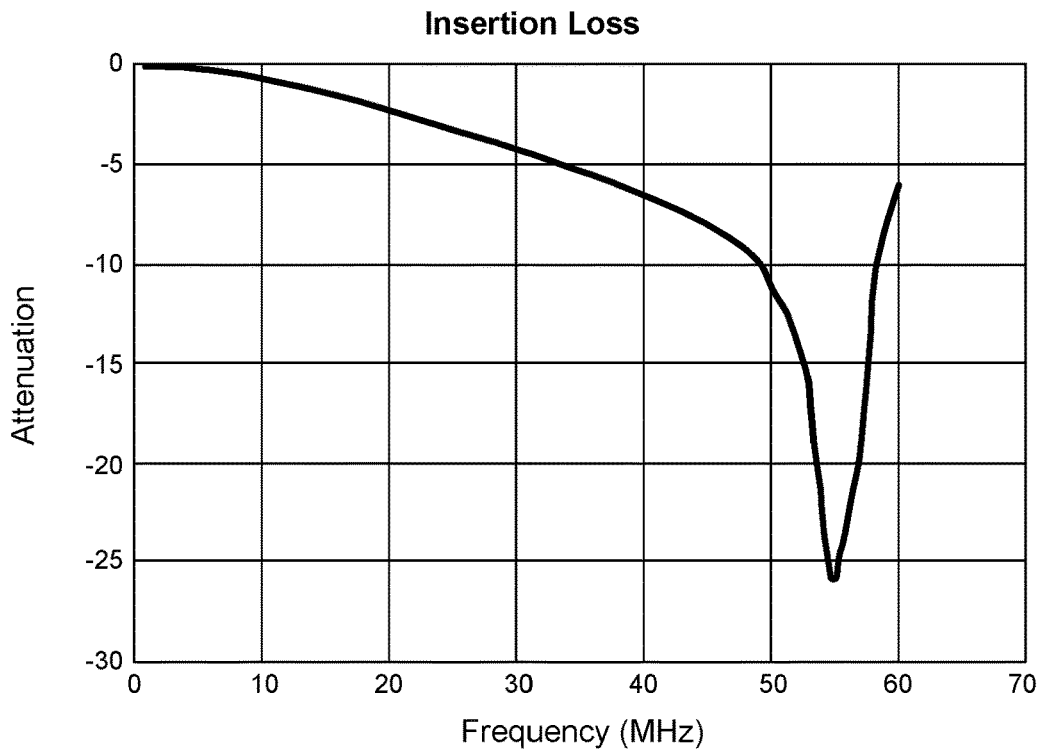
FIG. 4 shows a plot of RF field attenuation provided by a selected reject band non-RF-coupling tile of the present disclosure as a function of operating RF frequency, in accordance with some embodiments.

The selected reject band non-RF-coupling tile 200 is configured to provide maximum attenuation of an incident RF field at a particular operating RF frequency. FIG. 4 shows a plot of RF field attenuation provided by the selected reject band non-RF-coupling tile 200 as a function of operating RF frequency, in accordance with some embodiments. FIG. 4 shows how the example selected reject band non-RF-coupling tile 200 provides for maximum attenuation of the incident RF field when the operating RF frequency is near 55 megaHertz (MHz). It should be understood that the particular operating RF frequency at which the selected reject band non-RF-coupling tile 200 provides maximum RF field attenuation is dependent upon the configuration of the selected reject band non-RF-coupling tile 200, and is in no way limited to 55 MHz. In various embodiments, the selected reject band non-RF-coupling tile 200 can be configured to provide maximum RF field attenuation at RF operating frequencies within a range extending from about 100 kiloHertz to about 1000 MHz.

In some embodiments, the inductance (L) of the planar inductor 203 is calculated using the "Modified Wheeler Formula," such as described in "Simple Accurate Expressions for Planar Spiral Inductances," by Sunderarajan S. Mohan et al., IEEE Journal of Solid-State Circuits, Vol., 34, No. 10, October 1999. Also, the capacitance (C) of the PCB 201 between the planar inductor 203 and the ground plate 207 is calculated as $C=\varepsilon A/d$, where ($\varepsilon$) is the dielectric constant of the PCB 201 material between the planar inductor 203 and the ground plate 207, (A) is the area of the ground plate 207 that is overlapped by the planar inductor 203 (which is essentially the total bottom surface area of the planar inductor 203), and (d) is the distance between the planar inductor 203 and the ground plate 207 (which is the thickness of the PCB 201 between the planar inductor 203 and the ground plate 207). Once the inductance (L) of the planar inductor 203 and the capacitance (C) between the planar inductor 203 and the ground plate 207 are known, the resonance frequency of the selected reject band non-RF-coupling tile 200 is calculated as $F_{res}=1/[2\pi(LC)^{1/2}]$. Therefore, it should be understood that by controlling the configuration of the planar inductor 203 and corresponding inductance (L), and by controlling the thickness of the PCB 201 between the planar inductor 203 and the ground plate 207 and corresponding capacitance (C), it is possible to tune the resonance frequency ($F_{res}$) of the selected reject band non-RF-coupling tile 200 to a target operating RF frequency. In this manner, different configurations selected reject band non-RF-coupling tiles 200 can be made for use in blocking RF fields associated with different target RF operating frequencies.

Figure 5:
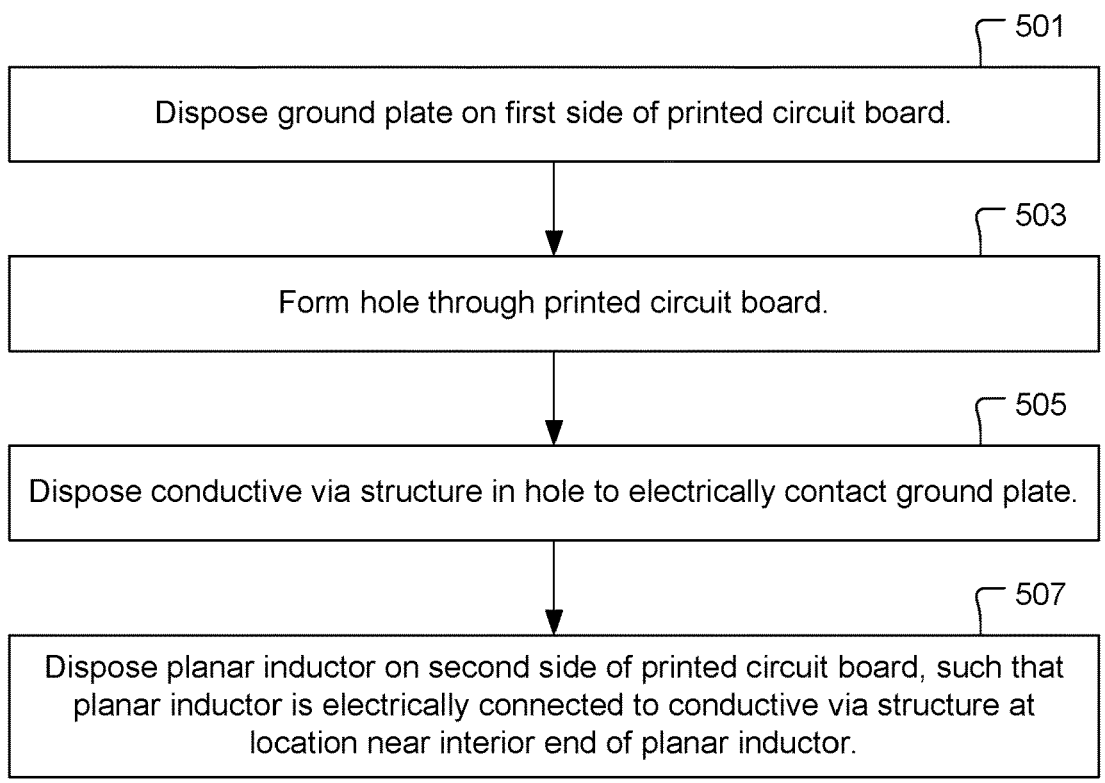
FIG. 5 shows a flowchart of a method for making a selected reject band non-RF-coupling tile of the present disclosure, in accordance with some embodiments.

FIG. 5 shows a flowchart of a method for making the selected reject band non-RF-coupling tile 200, in accordance with some embodiments. The method includes an operation 501 for disposing the ground plate 207 on a first side of the PCB 201. The method also includes an operation 503 for forming a hole through the PCB 201. In some embodiments, the operation 503 is performed before the operation 501. The method also includes an operation 505 for disposing the conductive via structure 205 within the hole to electrically contact the ground plate 207. The method also includes an operation 507 for disposing the planar inductor 203 on a second side of the PCB 201, where the planar inductor 203 is formed to have a spiral shape. The planar inductor 203 is disposed such that a location of the planar inductor 203 near the interior end 203A of the planar inductor 203 is in electrical contact with the conductive via structure 205. In some embodiments, the ground plate 207, the planar inductor 203, and the conductive via structure 205 are formed of copper, and the PCB 201 is formed of FR-4 glass epoxy. However, in other embodiments, the ground plate 207, the planar inductor 203, and the conductive via structure 205 can be formed of another electrically conductive material that is compatible with the PCB fabrication process. Also, in other embodiments, the PCB 201 can be formed of essentially any PCB substrate material. The method also includes controlling the configuration of the planar inductor 203 and the thickness of the PCB 201 to tune the resonance frequency ($F_{res}$) of the selected reject band non-RF-coupling tile 200 to a target operating RF frequency.

The selected reject band non-RF-coupling tile 200 provides a mechanism by which the size of an enclosure surrounding RF carrying circuitry can be reduced without incurring the adverse effects of the RF field coupling with grounded enclosure walls. The selected reject band non-RF-coupling tile 200 disclosed herein functions as an RF band reject filter when positioned between an RF field source, e.g., the RF signal carrying circuitry/devices, and the grounded enclosure wall, with the planar inductor 203 of the selected reject band non-RF-coupling tile 200 oriented to face toward the RF field source, and with the ground plate 207 of the selected reject band non-RF-coupling tile 200 in physical and electrical contact with the grounded enclosure wall.

Figure 6A:
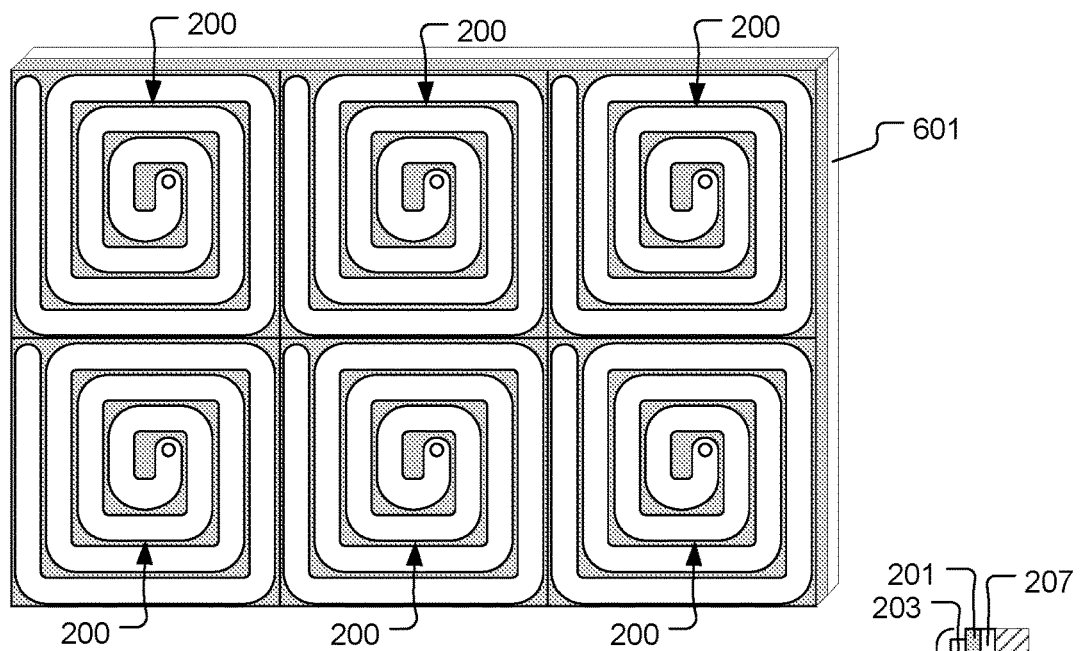
FIG. 6A shows an arrangement of six selected reject band non-RF-coupling tiles positioned on a wall of an enclosure, in accordance with some embodiments.
Figure 6B:
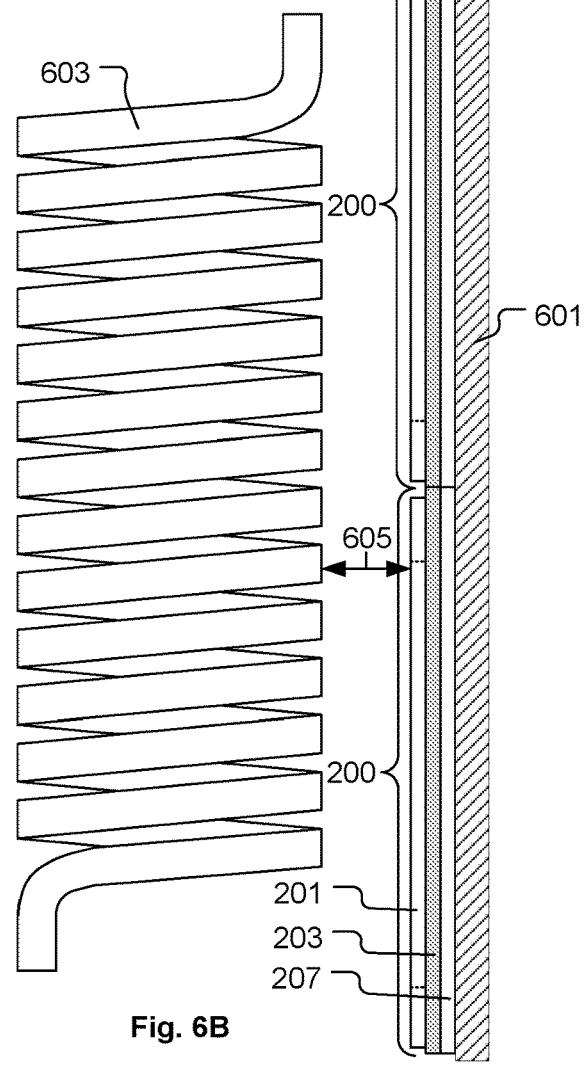
FIG. 6B shows a side view of the enclosure wall depicted in FIG. 6A, in accordance with some embodiments.

FIG. 6A shows an arrangement of six selected reject band non-RF-coupling tiles 200 positioned on a wall of an enclosure 601, in accordance with some embodiments. The enclosure 601 is electrically grounded. The configuration of FIG. 6A is an example to illustrate how the selected reject band non-RF-coupling tiles 200 can be positioned to essentially completely cover the interior wall surfaces of the enclosure 601 that is configured to surround RF carrying circuitry/devices. It should be understood that with different shapes and sizes of the selected reject band non-RF-coupling tile 200, such as described with regard to the selected reject band non-RF-coupling tiles 200A-200F in FIGS. 3A-3F, it is possible to essentially completely cover the interior wall surfaces of an enclosure that has essentially any size and shape. FIG. 6B shows a side view of the example enclosure 601 wall on which the selected reject band non-RF-coupling tiles 200 are positioned, in accordance with some embodiments. FIG. 6B illustrates how an RF carrying component 603, an inductor in this example, can be positioned a distance 605 from the selected reject band non-RF-coupling tiles 200, where the distance 605 is less than the distance that the RF field extends away from the RF carrying component 603. In this example, the RF field emanating from the RF carrying component 603 is blocked/reflected by the selected reject band non-RF-coupling tiles 200, so as to prevent coupling/interaction of the RF field with the grounded enclosure wall 601.

The selected reject band non-RF-coupling tile 200 is configured so that the planar inductor 203 resonates with the ground plate 207 and grounded enclosure wall 601 at a particular operating RF frequency. In this manner, when the selected reject band non-RF-coupling tiles 200 are positioned to have their ground plates 207 in physical and electrical contact with the grounded enclosure wall 601 and their planar inductors 203 facing toward the RF field at a particular operating RF frequency, the selected reject band non-RF-coupling tiles 200 provide for high attenuation of the RF field at the particularly operating RF frequency so as to prevent the RF field from coupling with the ground plates 207 and grounded enclosure wall 601. It should be understood that the selected reject band non-RF-coupling tiles 200 provides a mechanism for reducing the size of RF equipment enclosures, and correspondingly reduce the overall size of RF devices and systems.

In some embodiments, a selected reject band non-RF-coupling enclosure is provided. The selected reject band non-RF-coupling enclosure includes an enclosure wall formed of electrically conductive material. The enclosure wall is electrically connected to a reference ground potential. The enclosure wall has an interior side and an exterior side. The selected reject band non-RF-coupling enclosure includes an interior volume in which an RF field is generated. The selected reject band non-RF-coupling enclosure also includes at least one selected reject band non-RF-coupling tile 200 disposed on the interior side of the enclosure wall. Each of the at least one selected reject band non-RF-coupling tile 200 includes the corresponding ground plate 207 disposed on a first side of the corresponding PCB 201. The corresponding ground plate 207 is positioned in physical and electrical contact with the interior side of the enclosure wall. Each of the at least one selected reject band non-RF-coupling tile 200 includes the corresponding planar inductor 203 disposed on a second side of the corresponding PCB 201. Each of the at least one selected reject band non-RF-coupling tile 200 includes the corresponding conductive via structure 205 extending through the corresponding PCB 201 and electrically connecting with both the corresponding ground plate 207 and the corresponding planar inductor 203 at a location near the interior end 203A of the corresponding planar inductor 203. In some embodiments, the at least one selected reject band non-RF-coupling tile 200 prevents the RF field from coupling/interacting with an area of the enclosure wall that is covered by the at least one selected reject band non-RF-coupling tile 200. In some embodiments, the at least one selected reject band non-RF-coupling tile 200 substantially covers the interior side of the enclosure wall. In some embodiments, the at least one selected reject band non-RF-coupling tile 200 has one or more of a square shape, a hexagonal shape, an octagonal shape, a rectangular spiral shape, a circular shape, and a triangular shape.

FIG. 7 shows a flowchart of a method for forming a selected reject band non-RF-coupling enclosure, in accordance with some embodiments. The method includes an operation 701 for having the selected reject band non-RF-coupling tile 200 that includes the ground plate 207 disposed on a first side of the PCB 201 and the planar inductor 203 disposed on a second side of the PCB 201. The selected reject band non-RF-coupling tile 200 includes the conductive via structure 205 extending through the PCB 201 and electrically connecting with both the ground plate 207 and the planar inductor 203 at a location near the interior end 203A of the planar inductor 203. The method also includes an operation 703 for disposing the selected reject band non-RF-coupling tile 200 on an interior side of an enclosure wall, such that the ground plate 207 of the selected reject band non-RF-coupling tile 200 is in physical and electrical contact with the interior side of the enclosure wall. The enclosure wall is formed of electrically conductive material. The enclosure wall is electrically connected to a reference ground potential. The enclosure wall is part of an enclosure that includes an interior volume in which an RF field is to be generated. The selected reject band non-RF-coupling tile 200 prevents the RF field from coupling/interacting with an area of the enclosure wall that is covered by the selected reject band non-RF-coupling tile 200. In some embodiments, the selected reject band non-RF-coupling tile 200 substantially covers the interior side of the enclosure wall. In some embodiments, the selected reject band non-RF-coupling tile 200 has one or more of a square shape, a hexagonal shape, an octagonal shape, a rectangular spiral shape, a circular shape, and a triangular shape.

In some embodiments, the selected reject band non-RF-coupling tile 200 can be used to effectively encapsulate an RF carrying component, such that the RF field emanating from the RF carrying component does not extend through the selected reject band non-RF-coupling tile 200. In some embodiments, with RF carrying components individually encapsulated with selected reject band non-RF-coupling tiles 200, there is no RF field that can reach the grounded enclosure walls. Therefore, with RF carrying components individually encapsulated with selected reject band non-RF-coupling tiles 200, it may be possible to leave the surrounding grounded enclosure unshielded. Also, with RF carrying components individually encapsulated with selected reject band non-RF-coupling tiles 200, it may be possible to eliminate or reduce surrounding enclosures while still providing shielding and protection from radiation/RF interference. It should be appreciated that with elimination or reduction of surrounding enclosures, more space is freed up for use by other components.

Figure 8A:
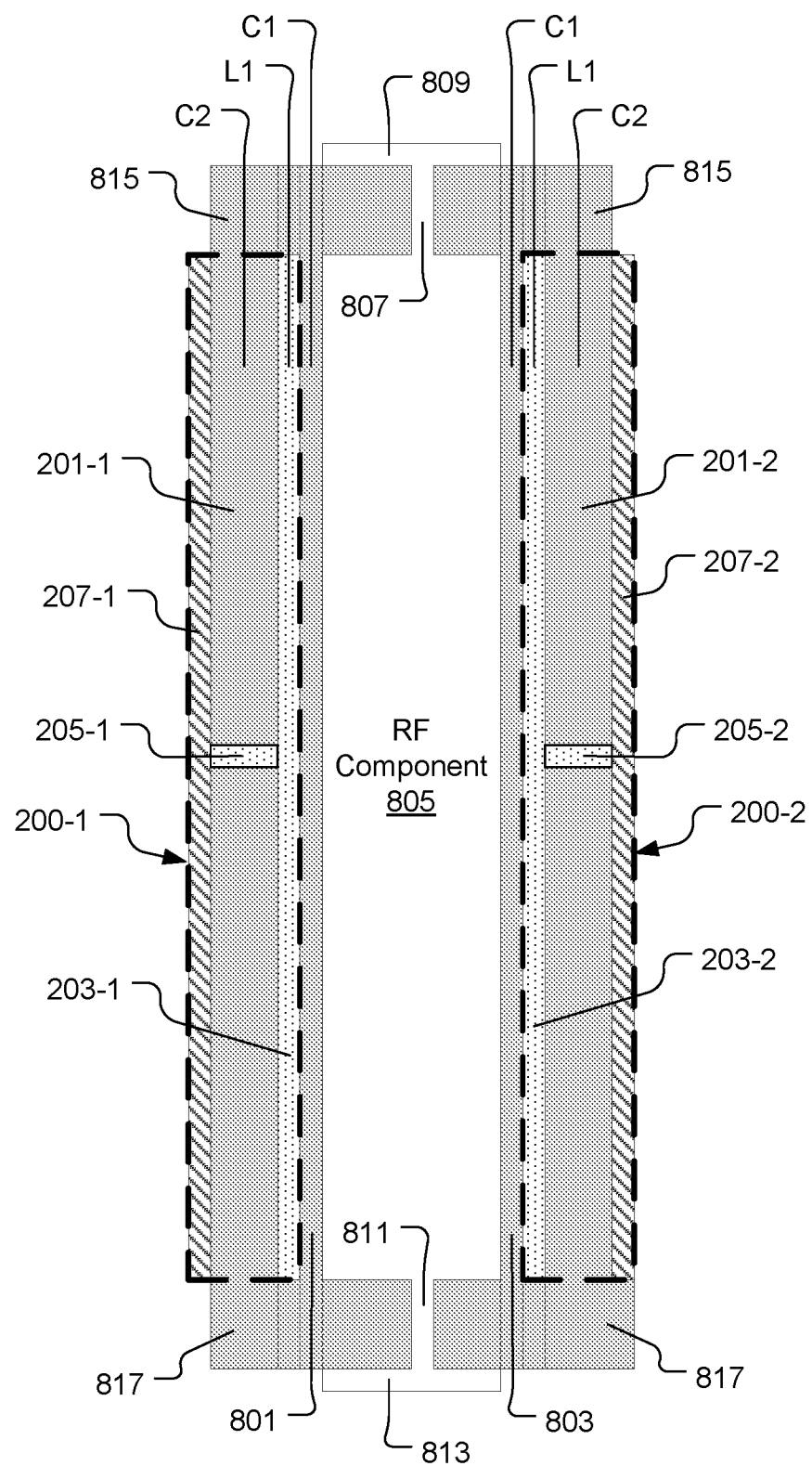
FIG. 8A shows an example arrangement of selected reject band non-RF-coupling tiles for effective encapsulation of an RF carrying component, in accordance with some embodiments.

FIG. 8A shows an example of how selected reject band non-RF-coupling tiles 200 can be used to effectively encapsulate an RF carrying component 805, in accordance with some embodiments. A first selected reject band non-RF-coupling tile 200-1 is positioned on one side of the RF carrying component 805, such that the planar inductor 203-1 of the first selected reject band non-RF-coupling tile 200-1 faces toward the RF carrying component 805. The first selected reject band non-RF-coupling tile 200-1 includes the ground plate 207-1, the PCB 201-1, the planar inductor 203-1, and the conductive via structure 205-1 as described with regard to selected reject band non-RF-coupling tile 200 of FIG. 2A. A second selected reject band non-RF-coupling tile 200-2 is positioned on another side of the RF carrying component 805, such that the planar inductor 203-2 of the second selected reject band non-RF-coupling tile 200-2 faces toward the RF carrying component 805. The second selected reject band non-RF-coupling tile 200-2 includes the ground plate 207-2, the PCB 201-2, the planar inductor 203-2, and the conductive via structure 205-2 as described with regard to the selected reject band non-RF-coupling tile 200 of FIG. 2A. A PCB substrate material 801 is disposed between the first selected reject band non-RF-coupling tile 200-1 and the RF carrying component 805. The PCB substrate material 801 binds to both the first selected reject band non-RF-coupling tile 200-1 and the RF carrying component 805. A PCB substrate material 803 is disposed between the second selected reject band non-RF-coupling tile 200-2 and the RF carrying component 805. The PCB substrate material 803 binds to both the second selected reject band non-RF-coupling tile 200-2 and the RF carrying component 805.

In some embodiments, a first end of the RF carrying component 805 is covered by a PCB material 815. An electrically conductive input terminal 809 is disposed on an exterior side of the PCB material 815. At least one electrical conductor 807 is electrically connected to the input terminal 809 and to the RF carrying component 805. In some embodiments, a second end of the RF carrying component 805 is covered by a PCB material 817. An electrically conductive output terminal 813 is disposed on an exterior side of the PCB material 817. At least one electrical conductor 811 is electrically connected to the output terminal 813 and to the RF carrying component 805.

Figure 8B:
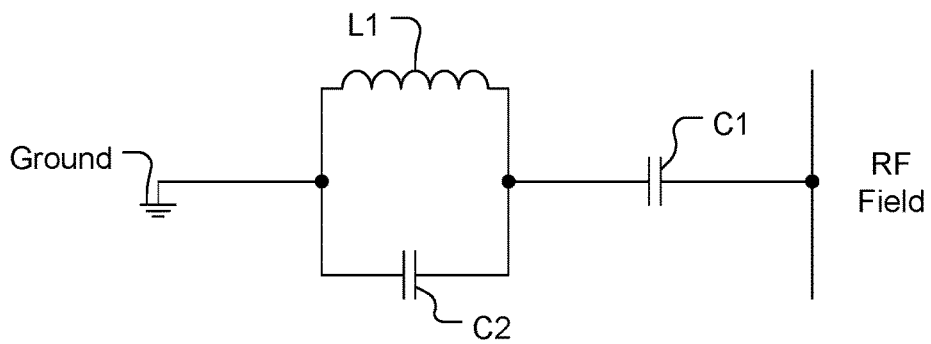
FIG. 8B shows a circuit diagram representing the electrical functionality of the first selected reject band non-RF-coupling tile in the configuration of FIG. 8A, in accordance with some embodiments.

In the configuration of FIG. 8A, each of the first selected reject band non-RF-coupling tile 200-1 and the second selected reject band non-RF-coupling tile 200-2 is configured to resonate at the operating RF frequency of the RF carrying component 805. In this manner, each of the first selected reject band non-RF-coupling tile 200-1 and the second selected reject band non-RF-coupling tile 200-2 functions to block/reflect the RF field emanating from the RF carrying component 805. FIG. 8B shows a circuit diagram representing the electrical functionality of the first selected reject band non-RF-coupling tile 200-1 in the configuration of FIG. 8A, in accordance with some embodiments. The electrical functionality of the second selected reject band non-RF-coupling tile 200-2 in the configuration of FIG. 8A is that same as that of the first selected reject band non-RF-coupling tile 200-1. Therefore, the circuit diagram of FIG. 8B equally describes each of the first selected reject band non-RF-coupling tile 200-1 and the second selected reject band non-RF-coupling tile 200-2. In the circuit diagram of FIG. 8B, the PCB substrate material 801 between the RF carrying component 805 and the planar inductor 203-1 is represented as a capacitance (C1). The RF carrying component 805 is represented as the RF field. The planar inductor 203-1 is represented as an inductance (L1). The PCB 201-1 between the planar inductor 203-1 and the ground plate 207-1 is represented as a capacitance (C2). And, the ground plate 207-1 is represented as the electrical ground. As the PCB substrate material 801 between the RF carrying component 805 and the planar inductor 203-1 gets thinner, the capacitance (C1) increases, vice-versa. Also, as the PCB 201-1 between the planar inductor 203-1 and the ground plate 207-1 gets thinner, the capacitance (C2) increases, vice-versa. Also, the configuration of the planar inductor 203-1 can be varied to change the inductance (L1) of the planar inductor 203-1. As previously mentioned, in some embodiments, the inductance of the planar inductor 203-1 is determined using the "Modified Wheeler Formula."

Figure 8C:
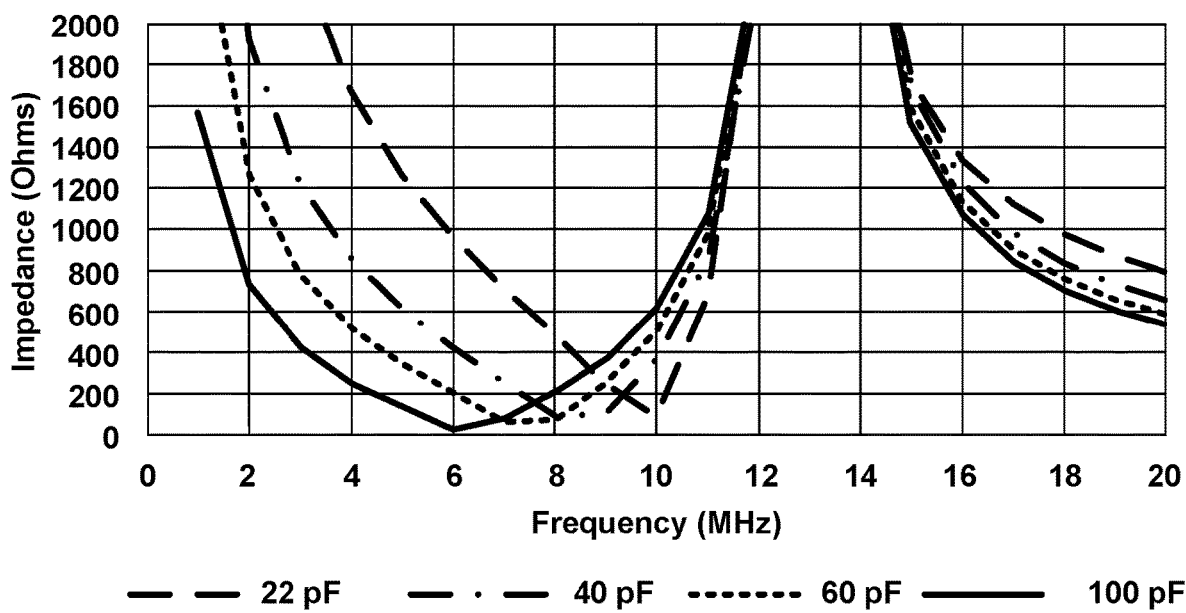
FIG. 8C shows plots of impedance provided by the first selected reject band non-RF-coupling tile as a function of frequency for different values of the capacitance (C1), based on the circuit of FIG. 8B, in accordance with some embodiments.

FIG. 8C shows plots of impedance provided by the first selected reject band non-RF-coupling tile 200-1 as a function of frequency for different values of the capacitance (C1), based on the circuit of FIG. 8B, in accordance with some embodiments. The data of FIG. 8C indicates that a higher value of the capacitance (C1) provides a broader band of RF frequencies that can be blocked/reflected by the first selected reject band non-RF-coupling tile 200-1. Therefore, it is of interest to increase the value of the capacitance (C1). In order to increase the value of the capacitance (C1) is it necessary to reduce the thickness of the PCB substrate material 801 between the RF carrying component 805 and the planar inductor 203-1 as much as possible. In some embodiments, the thickness of the PCB substrate material 801 between the RF carrying component 805 and the planar inductor 203-1 is less than about 1 millimeter. In some embodiments, the thickness of the PCB substrate material 801 between the RF carrying component 805 and the planar inductor 203-1 is less than about 0.5 millimeter. In some embodiments, the thickness of the PCB substrate material 801 between the RF carrying component 805 and the planar inductor 203-1 is a thinnest available PCB layer thickness.

Figure 8D:
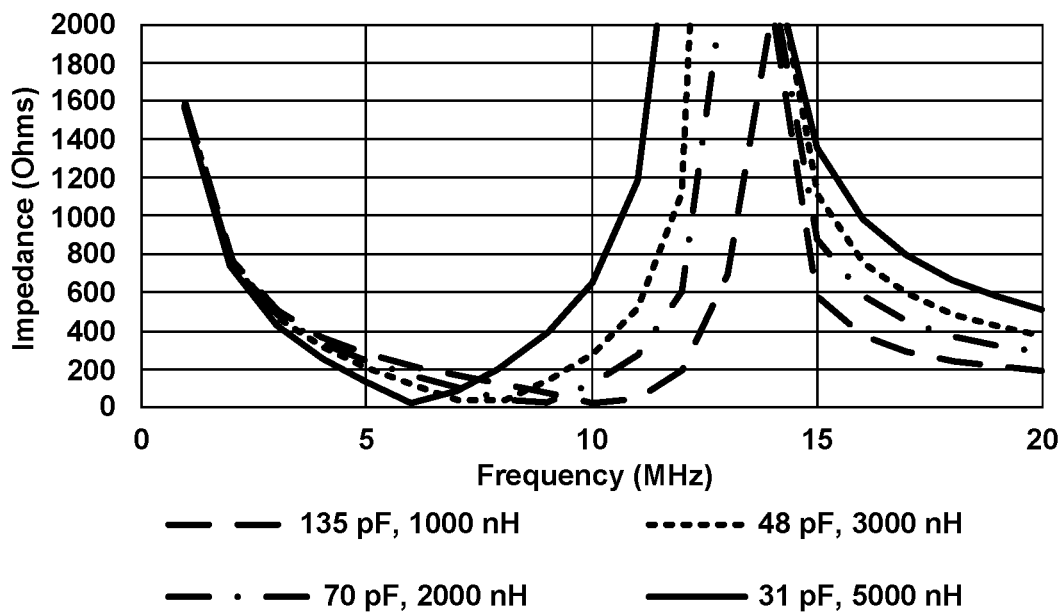
FIG. 8D shows plots of impedance provided by the first selected reject band non-RF-coupling tile as a function of frequency for different values of both the capacitance (C2) and the inductance (L1), based on the circuit of FIG. 8B, in accordance with some embodiments.

FIG. 8D shows plots of impedance provided by the first selected reject band non-RF-coupling tile 200-1 as a function of frequency for different values of both the capacitance (C2) and the inductance (L1), based on the circuit of FIG. 8B, in accordance with some embodiments. The data of FIG. 8D indicates that a lower value of the capacitance (C2) in combination with a higher value of the inductance (L1) provides a broader band of RF frequencies that can be blocked/reflected by the first selected reject band non-RF-coupling tile 200-1. Therefore, it is of interest to decrease the value of the capacitance (C2). In order to decrease the value of the capacitance (C2) is it necessary to increase the thickness of the PCB 201-1 between the planar inductor 203-1 and the ground plate 207-1. In some embodiments, the thickness of the PCB 201-1 between the planar inductor 203-1 and the ground plate 207-1 is up to about 6 millimeters. In some embodiments, the thickness of the PCB 201-1 between the planar inductor 203-1 and the ground plate 207-1 is within a range extending from about 1 millimeter to about 6 millimeters. In some embodiments, the thickness of the PCB 201-1 between the planar inductor 203-1 and the ground plate 207-1 is within a range extending from about 3 millimeters to about 4 millimeters. In some embodiments, the thickness of the PCB 201-1 between the planar inductor 203-1 and the ground plate 207-1 is a thickest available PCB layer thickness. In some embodiments, the thickness of the PCB 201-1 between the planar inductor 203-1 and the ground plate 207-1 is formed by multiple stacked PCB layers.

In some embodiments, an RF line filter is a particular example of an RF carrying component 805 that can be effectively encapsulated by selected reject band non-RF-coupling tiles 200. The RF line filter is configured to filter RF frequencies in a frequency band within which an operating RF frequency exists. The RF line filter is disposed in the RF power path to prevent RF signals from adversely coupling with other electrical components. For example, in some semiconductor fabrication systems, the RF line filter is installed to prevent RF from coupling into a heater array and traveling back to a heater power supply. In this example, the RF line filter is put in the heater power supply path between the heater power supply and the heater. A conventional RF line filter is an open air RF line filter that emanates a large RF field that can interact with components and/or ground walls far away. Based on the configuration of FIG. 8A, the conventional RF line filter can be reconfigured and encapsulated by the selected reject band non-RF-coupling tiles 200 to prevent RF field interaction with neighboring electrical components and/or ground walls.

Figure 9A:
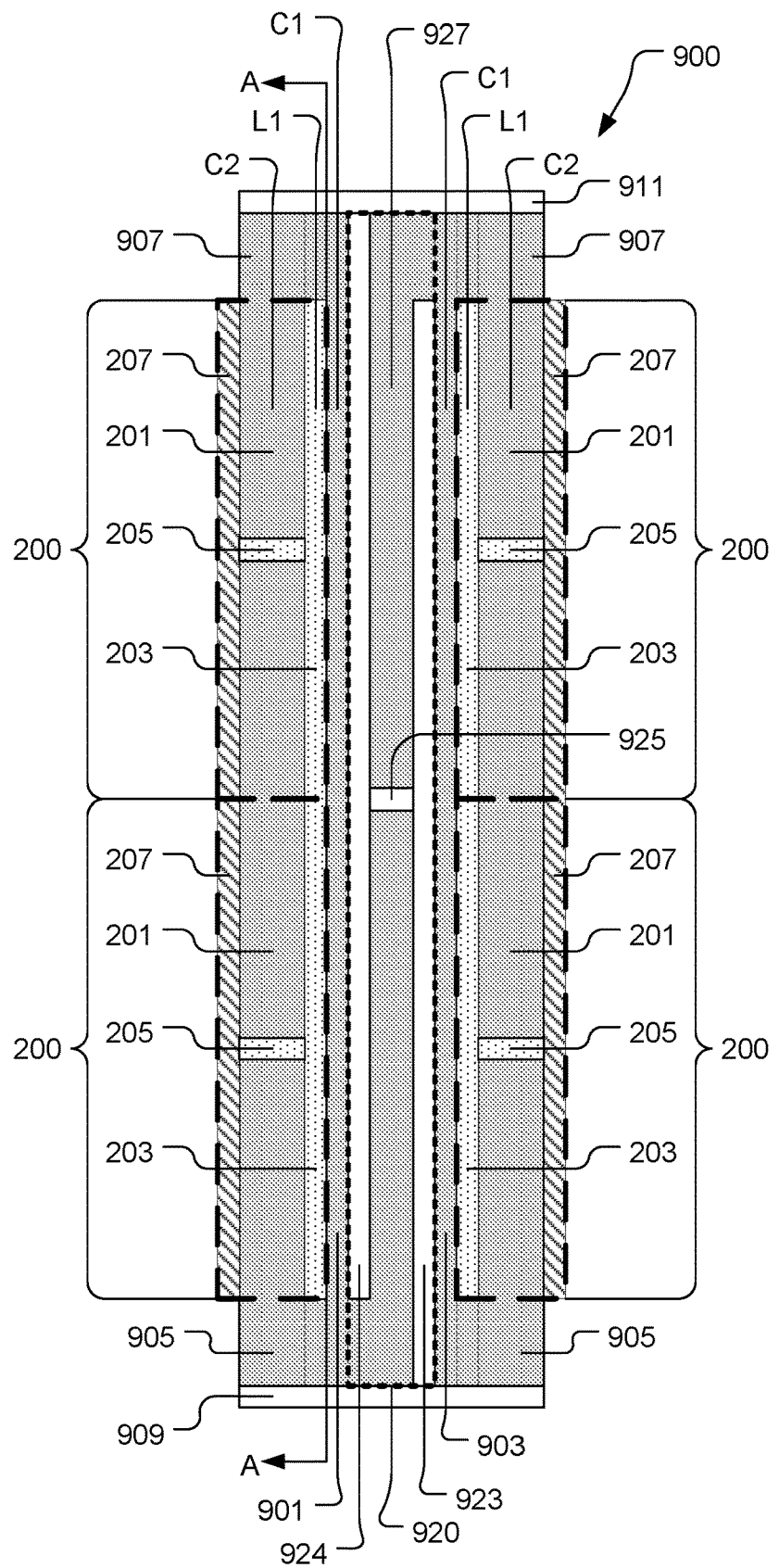
FIG. 9A shows an RF shielded RF line filter, in accordance with some embodiments.

FIG. 9A shows an RF shielded RF line filter 900, in accordance with some embodiments. FIG. 9A shows an example of how selected reject band non-RF-coupling tiles 200 can be used to effectively encapsulate an RF line filter 920 to form the RF shielded RF line filter 900. A first set of four selected reject band non-RF-coupling tiles 200 is positioned on one side of the RF line filter 920, such that the planar inductors 203 of the first set of four selected reject band non-RF-coupling tiles 200 face toward the RF line filter 920. A second set of four selected reject band non-RF-coupling tiles 200 is positioned on another side of the RF line filter 920, such that the planar inductors 203 of the second set of four selected reject band non-RF-coupling tiles 200 face toward the RF line filter 920. Each selected reject band non-RF-coupling tile 200 in the first and second sets of four selected reject band non-RF-coupling tiles 200 includes the ground plate 207, the PCB 201, the planar inductor 203, and the conductive via structure 205 as described with regard to the selected reject band non-RF-coupling tile 200 of FIG. 2A. A PCB substrate material 901 is disposed between the first set of four selected reject band non-RF-coupling tiles 200 and the RF line filter 920. The PCB substrate material 901 binds to each of the first set of four selected reject band non-RF-coupling tiles 200 and the RF line filter 920. A PCB substrate material 903 is disposed between the second set of four selected reject band non-RF-coupling tiles 200 and the RF line filter 920. The PCB substrate material 903 binds to each of the second set of four selected reject band non-RF-coupling tiles 200 and the RF line filter 920.

In some embodiments, a first end of the RF line filter 920 is covered by a PCB material 907. An electrically conductive input terminal 911 is disposed on an exterior side of the PCB material 907. The input terminal 911 is electrically connected to the RF line filter 920. In some embodiments, a second end of the RF line filter 920 is covered by a PCB material 905. An electrically conductive output terminal 909 is disposed on an exterior side of the PCB material 905. The output terminal 909 is electrically connected to the RF line filter 920.

In the configuration of FIG. 9A, each selected reject band non-RF-coupling tile 200 of the first set of four selected reject band non-RF-coupling tiles 200 and the second set of four selected reject band non-RF-coupling tiles 200 is configured to resonate at the operating RF frequency of the RF line filter 920. In this manner, each of the selected reject band non-RF-coupling tiles 200 functions to block/reflect the RF field emanating from the RF line filter 920. The circuit diagram of FIG. 8B describes the electrical functionality of each of the selected reject band non-RF-coupling tiles 200 in the configuration of FIG. 9A.

Figure 9B:
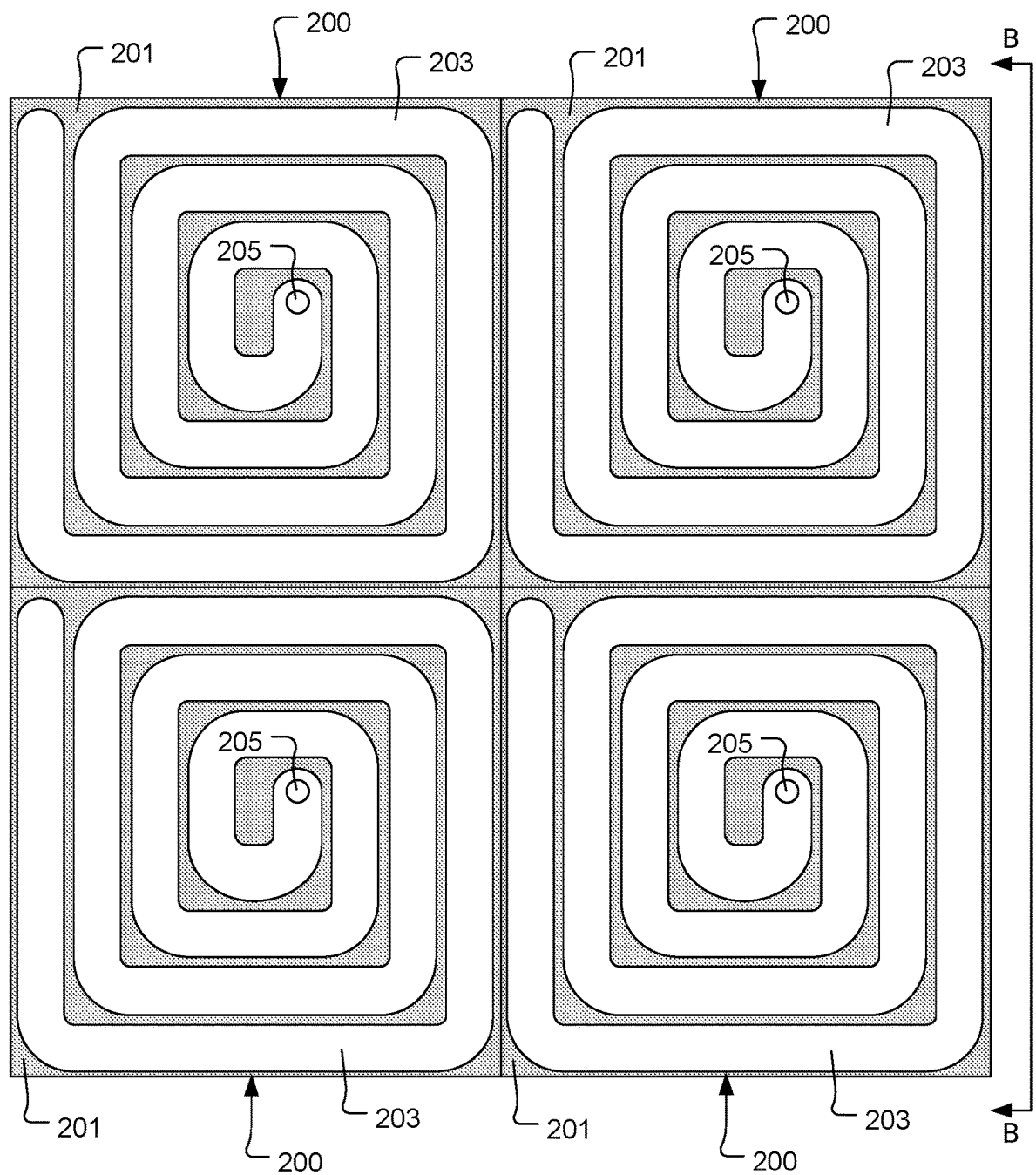
FIG. 9B shows a view looking toward the planar inductors of the first set of four selected reject band non-RF-coupling tiles, referenced as View A-A in FIG. 9A, in accordance with some embodiments.
Figure 9C:
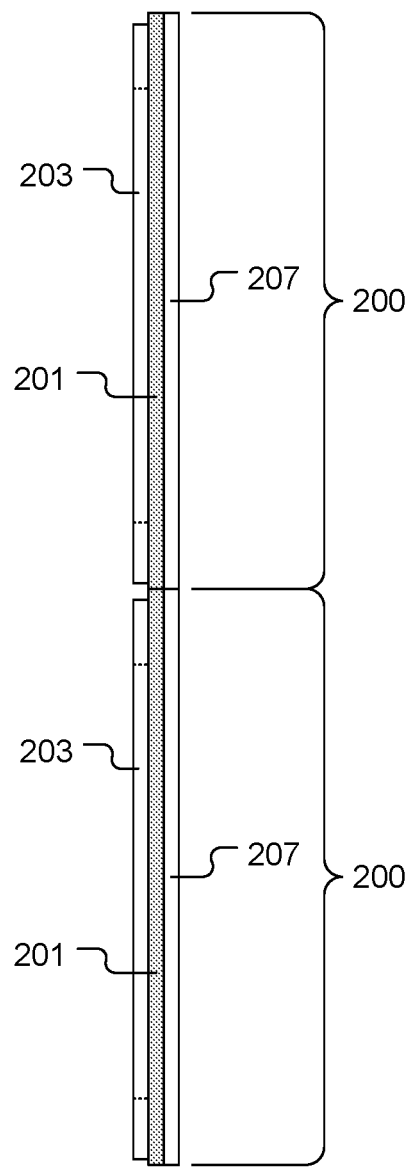
FIG. 9C shows a side view of the first set of four selected reject band non-RF-coupling tiles, referenced as View B-B in FIG. 9B, in accordance with some embodiments.

FIG. 9B shows a view looking toward the planar inductors 203 of the first set of four selected reject band non-RF-coupling tiles 200, referenced as View A-A in FIG. 9A, in accordance with some embodiments. The view looking toward the planar inductors 203 of the second set of four selected reject band non-RF-coupling tiles 200 is the same as shown in FIG. 9B. FIG. 9C shows a side view of the first set of four selected reject band non-RF-coupling tiles 200, referenced as View B-B in FIG. 9B, in accordance with some embodiments. The side view looking toward the second set of four selected reject band non-RF-coupling tiles 200 is the same as shown in FIG. 9C.

Figure 9D:
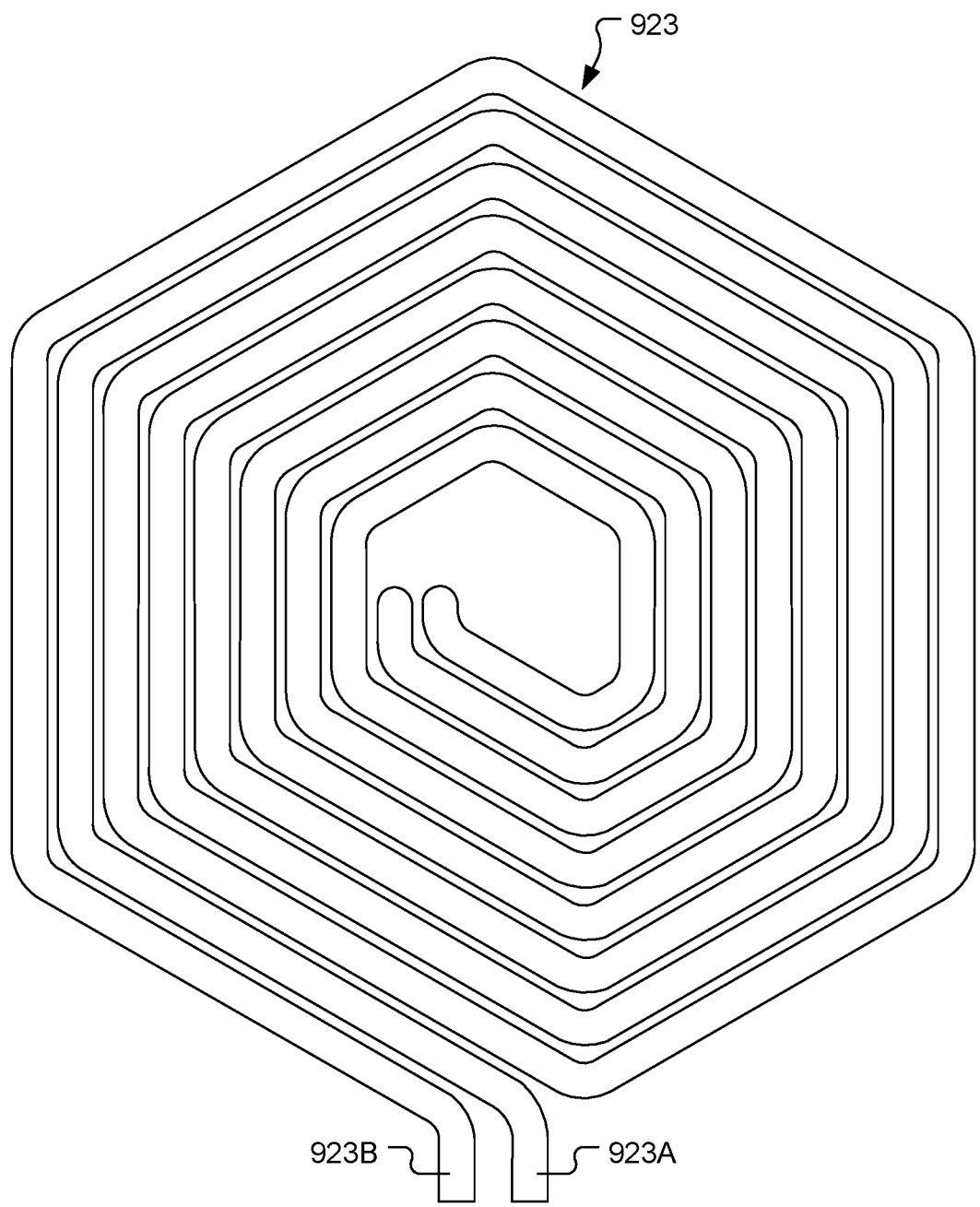
FIG. 9D shows a first half of the RF line filter, in accordance with some embodiments.
Figure 9E:
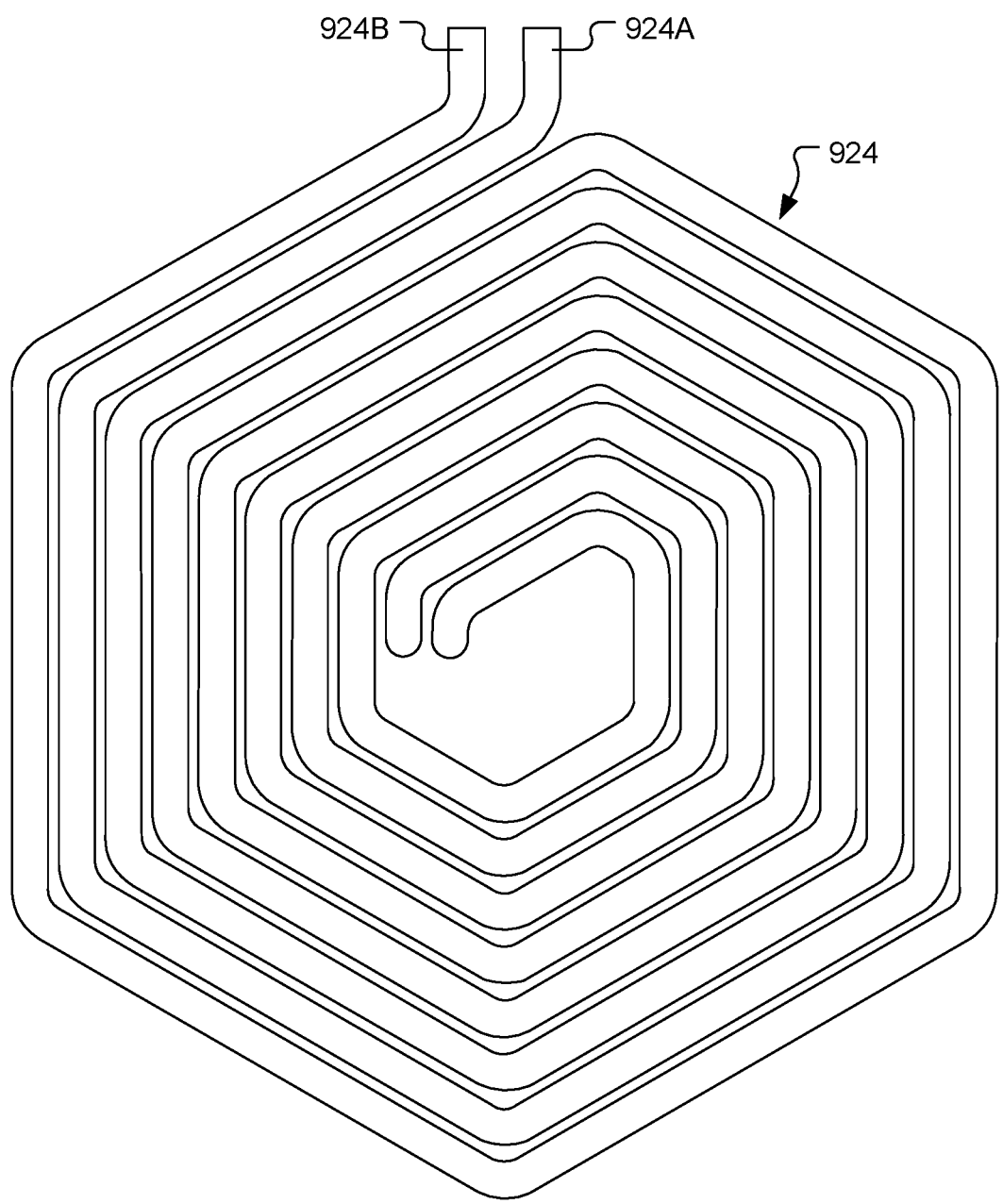
FIG. 9E shows a second half of the RF line filter, in accordance with some embodiments.
Figure 9F:
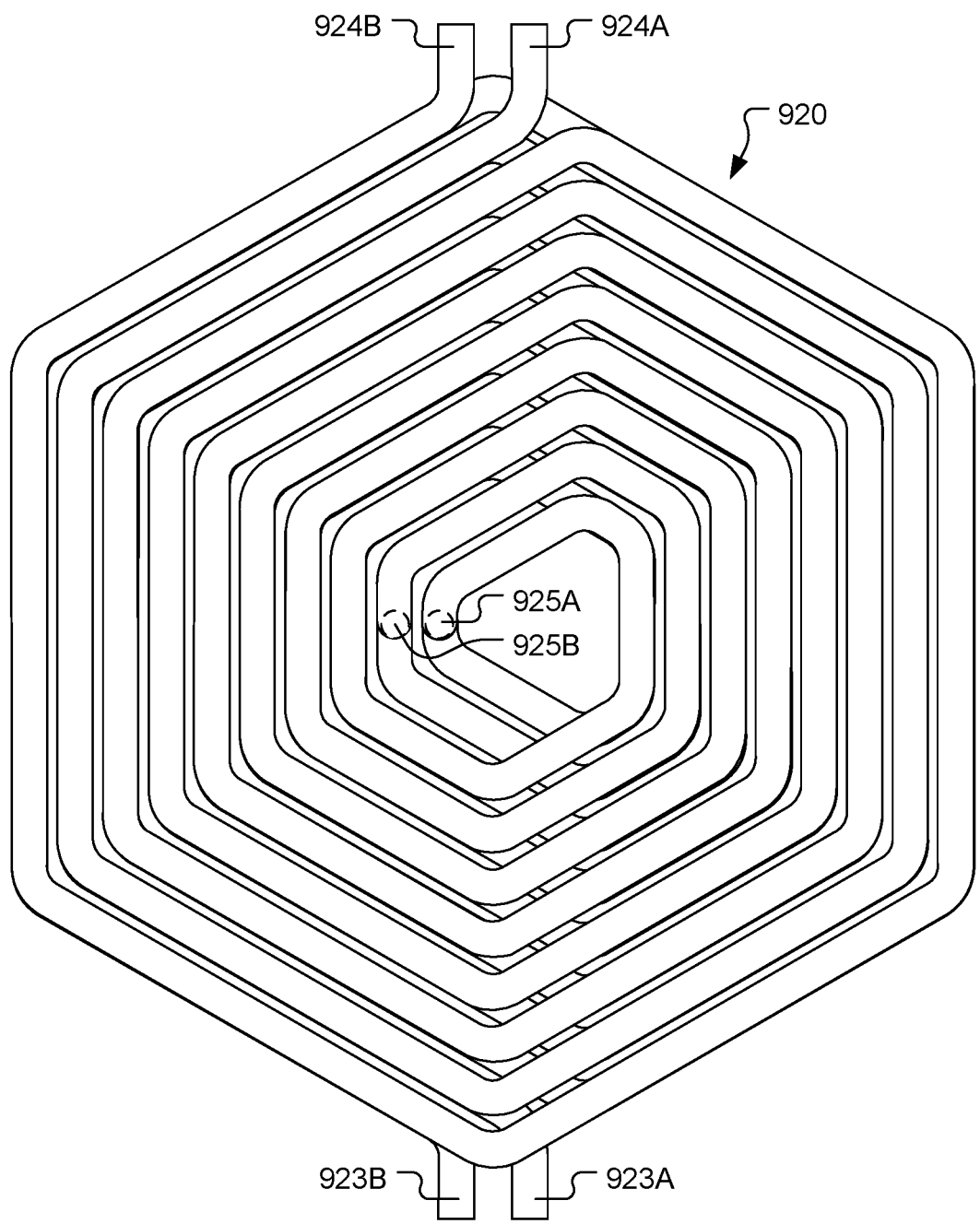
FIG. 9F shows an assembly of the first half and the second half of the RF line filter, in accordance with some embodiments.

FIG. 9D shows a first half 923 of the RF line filter 920, in accordance with some embodiments. The first half 923 includes a hexagonal double planar spiral of electrically conductive material, that includes a first hexagonal planar spiral 923A of electrically conductive material and a second hexagonal planar spiral 923B of electrically conductive material. FIG. 9E shows a second half 924 of the RF line filter 920, in accordance with some embodiments. The second half 924 includes a hexagonal double planar spiral of electrically conductive material, that includes a first hexagonal planar spiral 924A of electrically conductive material and a second hexagonal planar spiral 924B of electrically conductive material. FIG. 9F shows an assembly of the first half 923 and the second half 924 of the RF line filter 920, in accordance with some embodiments. The first hexagonal planar spiral 923A of the first half 923 is electrically connected to the first hexagonal planar spiral 924A of the second half 924 by a conductive via structure 925A. Similarly, the second hexagonal planar spiral 923B of the first half 923 is electrically connected to the second hexagonal planar spiral 924B of the second half 924 by a conductive via structure 925B. With reference back to FIG. 9A, a PCB material 927 is disposed between the first half 923 and the second half 924 of the RF line filter 920. Also, in FIG. 9A, the conductive via structures 925A and 925B are represented by the conductive via structure 925 that extends through the PCM material 927 to electrically connect the first half 923 of the RF line filter 920 to the second half 924 of the RF line filter 920.

Figure 9G:
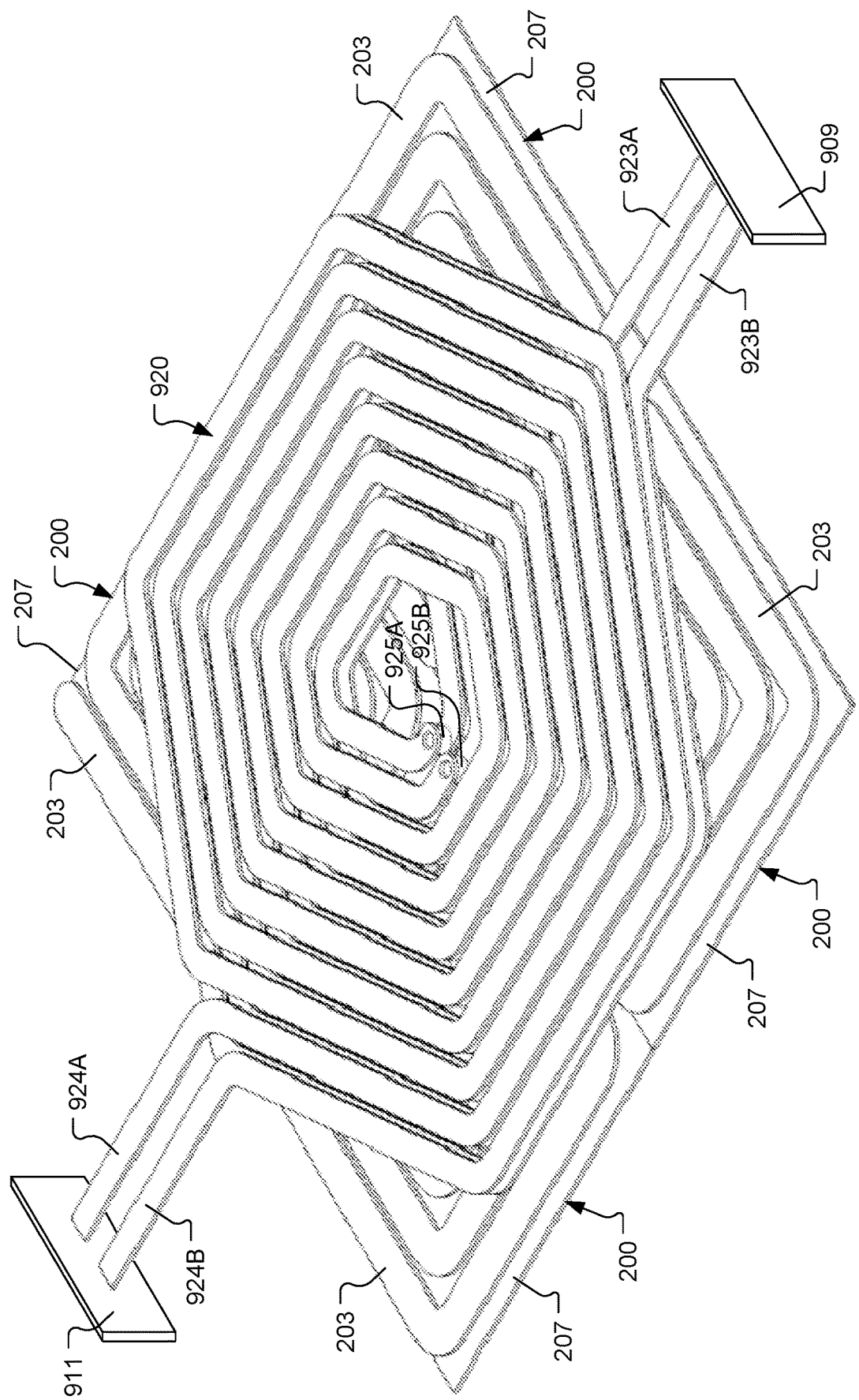
FIG. 9G shows an isometric view of a partial assembly of the RF shielded RF line filter, in accordance with some embodiments.
Figure 9H:
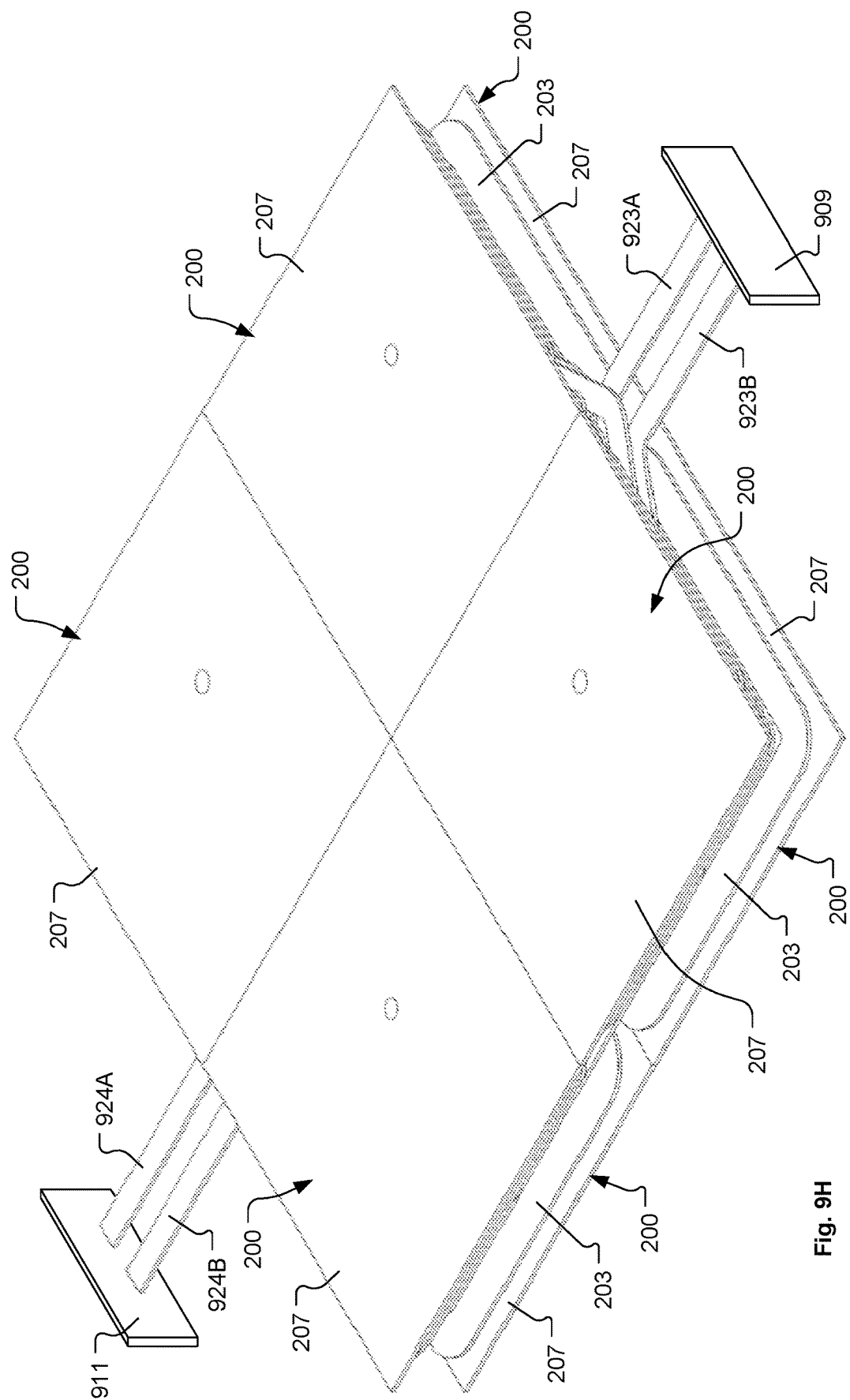
FIG. 9H shows the isometric view of FIG. 9G with the second set of four selected reject band non-RF-coupling tiles positioned on the side of the RF line filter, as shown in FIG. 9A, in accordance with some embodiments.

FIG. 9G shows an isometric view of a partial assembly of the RF shielded RF line filter 900, in accordance with some embodiments. The PCB materials 201, 901, 903, and 927 are not shown in FIG. 9G so as to avoid obscuring other features. Each of the first hexagonal planar spiral 923A and the second hexagonal spiral 923B of the first half 923 of the RF line filter 920 is electrically connected to the output terminal 909. Also, each of the first hexagonal planar spiral 924A and the second hexagonal spiral 924B of the second half 924 of the RF line filter 920 is electrically connected to the input terminal 911. FIG. 9H shows the isometric view of FIG. 9G with the second set of four selected reject band non-RF-coupling tiles 200 positioned on the side of the RF line filter 920, as shown in FIG. 9A, in accordance with some embodiments.

In some embodiments of the RF shielded RF line filter 900, the first set of four selected reject band non-RF-coupling tiles 200 is a first monolithic selected reject band non-RF-coupling tile that has a contiguous ground plate 207 and four separate planar inductors connected to the ground plate 207 through respective conductive vias 205, with continuous PCB 201 material disposed between the ground plate 207 and each of the four planar inductors 203. Also, in these embodiments, the second set of four selected reject band non-RF-coupling tiles 200 is a second monolithic selected reject band non-RF-coupling tile that has a contiguous ground plate 207 and four separate planar inductors connected to the ground plate 207 through respective conductive vias 205, with continuous PCB 201 material disposed between the ground plate 207 and each of the four planar inductors 203. In these embodiments of the RF shielded RF line filter 900, the RF line filter 920 is a planar-shaped RF line filter disposed between the first monolithic selected reject band non-RF-coupling tile and the second monolithic selected reject band non-RF-coupling tile. In these embodiments of the RF shielded RF line filter 900, the first monolithic selected reject band non-RF-coupling tile, the second monolithic selected reject band non-RF-coupling tile, and the planar-shaped RF line filter 920 are integrally formed as a single unit.

Figure 10:
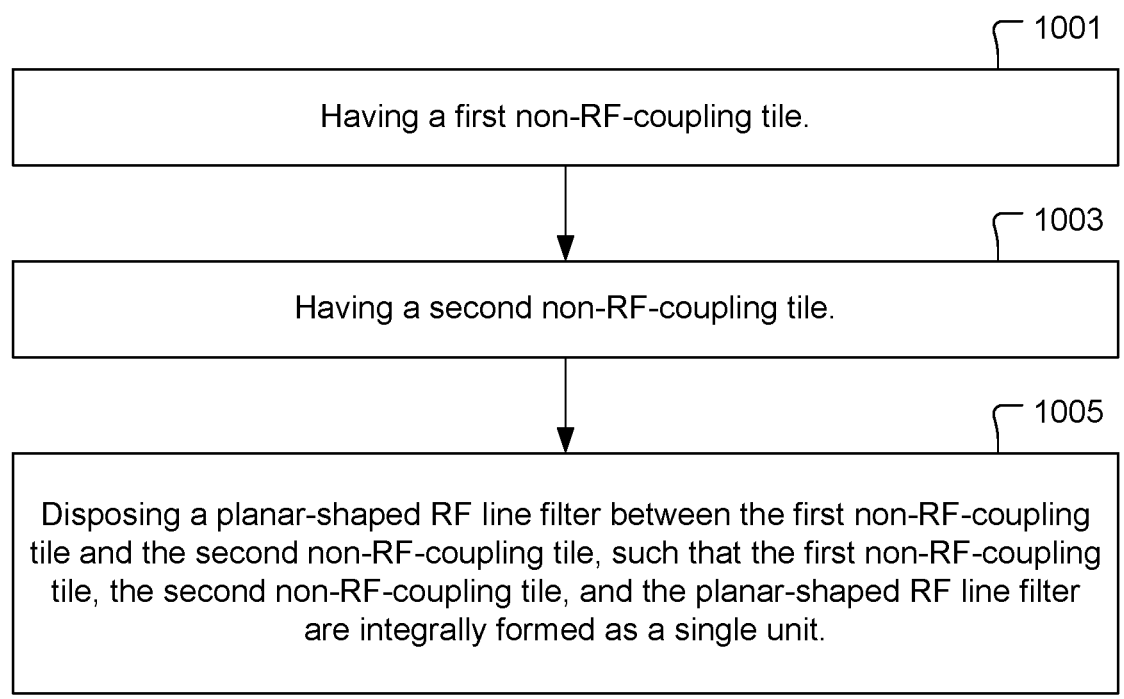
FIG. 10 shows a flowchart of a method for forming an RF signal filter, in accordance with some embodiments.

FIG. 10 shows a flowchart of a method for forming an RF signal filter, in accordance with some embodiments. The method includes an operation 1001 for having a first selected reject band non-RF-coupling tile 200. The method includes an operation 1003 for having a second selected reject band non-RF-coupling tile 200. The method includes an operation 1005 for disposing a planar-shaped RF line filter 920 between the first selected reject band non-RF-coupling tile 200 and the second selected reject band non-RF-coupling tile 200, such that the first selected reject band non-RF-coupling tile 200, the second selected reject band non-RF-coupling tile 200, and the planar-shaped RF line filter 920 are integrally formed as a single unit.

In some embodiments of the method, each of the first selected reject band non-RF-coupling tile 200 and the second selected reject band non-RF-coupling tile 200 is formed by disposing a corresponding ground plate 207 on a first side of a corresponding PCB 201, and forming a hole through the corresponding PCB 201, and disposing a corresponding conductive via structure 205 within the hole to electrically contact the corresponding ground plate 207, and disposing a corresponding planar inductor 203 on a second side of the corresponding PCB 201. The corresponding planar inductor 203 is disposed such that the planar inductor 203 is in electrical contact with the corresponding conductive via structure 205 at a location near the interior end 203A of the planar inductor 203. The method also includes orienting the corresponding planar inductor 203 of the first selected reject band non-RF-coupling tile 200 to face toward the planar-shaped RF line filter 920. The method also includes orienting the corresponding planar inductor 203 of the second selected reject band non-RF-coupling tile 200 to face toward the planar-shaped RF line filter 920.

The method also includes disposing a first thickness of PCB material 901 between the corresponding planar inductor 203 of the first selected reject band non-RF-coupling tile 200 and the planar-shaped RF line filter 920. The method also includes disposing a second thickness of PCB material 903 between the corresponding planar inductor 203 of the second selected reject band non-RF-coupling tile 200 and the planar-shaped RF line filter 920. In some embodiments, the first thickness of PCB material 901 is substantially equal to the second thickness of PCB material 903. In some embodiments, the thickness of the PCB 201 of the first selected reject band non-RF-coupling tile 200 is greater than or equal to the first thickness of PCB material 901, and the thickness of the PCB 201 of the second selected reject band non-RF-coupling tile 200 is greater than or equal to the second thickness of PCB material 903.

In some embodiments, the method includes forming the planar-shaped RF line filter 920 to include a planar spiral-shaped inductor having an electrical input at a first edge of the RF signal filter and an electrical output at a second edge of the RF signal filter. In some embodiments, the method includes forming the planar spiral-shaped inductor to include a first planar spiral-shaped conductor 923 that turns in a first direction from an exterior end of the first planar spiral-shaped conductor 923 to an interior end of the first planar spiral-shaped conductor 923. The method also includes forming the planar spiral-shaped inductor to include a second planar spiral-shaped conductor 924 that turns in the first direction from an interior end of the second planar spiral-shaped conductor 924 to an exterior end of the second planar spiral-shaped conductor 924. The method also includes orienting the first planar spiral-shaped conductor 923 substantially parallel to the second planar spiral-shaped conductor 924. The method also includes connecting the exterior end of the first planar spiral-shaped conductor 923 to the electrical input of the RF signal filter. The method also includes connecting the exterior end of the second planar spiral-shaped conductor 924 to the electrical output of the RF signal filter. The method also includes connecting the interior end of the first planar spiral-shaped conductor 923 to an interior via structure 925. The method also includes connecting the interior end of the second planar spiral-shaped conductor 924 to the interior conductive via structure 925. In some embodiments, the method also includes disposing a third thickness of PCB material 927 between the first planar spiral-shaped conductor 923 and second planar spiral-shaped conductor 924 of the RF line filter, such that the interior conductive via structure 925 extends through the third thickness of PCB material 927.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A radiofrequency signal filter, comprising:
a first selected reject band non-radiofrequency-coupling tile;
a second selected reject band non-radiofrequency-coupling tile; and
a planar-shaped radiofrequency line filter disposed between the first selected reject band non-radiofrequency-coupling tile and the second selected reject band non-radiofrequency-coupling tile,
wherein the first selected reject band non-radiofrequency-coupling tile, the second non-radiofrequency coupling tile, and the planar-shaped radiofrequency line filter are integrally formed as a single unit.

2. The radiofrequency signal filter as recited in claim 1, wherein each of the first and second selected reject band non-radiofrequency-coupling tiles includes a corresponding ground plate disposed on a first side of a corresponding printed circuit board, each of the first and second selected reject band non-radiofrequency-coupling tiles including a corresponding planar inductor disposed on a second side of the corresponding printed circuit board, each of the first and second selected reject band non-radiofrequency-coupling tiles including a corresponding conductive via structure extending through the corresponding printed circuit board and electrically connecting with both the corresponding ground plate and the corresponding planar inductor at a location near an interior end of the corresponding planar inductor.

3. The radiofrequency signal filter as recited in claim 2, wherein the corresponding planar inductor of the first selected reject band non-radiofrequency-coupling tile is oriented to face toward the planar-shaped radiofrequency line filter, and the corresponding planar inductor of the second selected reject band non-radiofrequency-coupling tile is oriented to face toward the planar-shaped radiofrequency line filter.

4. The radiofrequency signal filter as recited in claim 3, further comprising:
a first thickness of printed circuit board material disposed between the corresponding planar inductor of the first selected reject band non-radiofrequency-coupling tile and the planar-shaped radiofrequency line filter; and
a second thickness of printed circuit board material disposed between the corresponding planar inductor of the second selected reject band non-radiofrequency-coupling tile and the planar-shaped radiofrequency line filter.

5. The radiofrequency signal filter as recited in claim 4, wherein the first thickness of printed circuit board material is substantially equal to the second thickness of printed circuit board material.

6. The radiofrequency signal filter as recited in claim 4, wherein the planar-shaped radiofrequency line filter includes a planar spiral-shaped inductor having an electrical input at a first edge of the radiofrequency signal filter and an electrical output at a second edge of the radiofrequency signal filter.

7. The radiofrequency signal filter as recited in claim 6, wherein the planar spiral-shaped inductor includes a first planar spiral-shaped conductor that turns in a first direction from an exterior end of the first planar spiral-shaped conductor to an interior end of the first spiral-shaped conductor, the planar spiral-shaped inductor including a second planar spiral-shaped conductor that turns in the first direction from an interior end of the second planar spiral-shaped conductor to an exterior end of the second planar spiral-shaped conductor, the first planar spiral-shaped conductor oriented substantially parallel to the second planar spiral-shaped conductor, the exterior end of the first planar spiral-shaped conductor connected to the electrical input, the exterior end of the second planar spiral-shaped conductor connected to the electrical output, the interior end of the first planar spiral-shaped conductor connected to an interior conductive via structure, the interior end of the second planar spiral-shaped conductor connected to the interior conductive via structure.

8. The radiofrequency signal filter as recited in claim 7, wherein the first and second planar spiral-shaped conductors are separated from each other by a third thickness of printed circuit board material, the interior conductive via structure extending through the third thickness of printed circuit board material.

9. The radiofrequency signal filter as recited in claim 4, wherein a thickness of the corresponding printed circuit board of the first selected reject band non-radiofrequency-coupling tile is greater than or equal to the first thickness of printed circuit board material, and wherein a thickness of the corresponding printed circuit board of the second selected reject band non-radiofrequency-coupling tile is greater than or equal to the second thickness of printed circuit board material.

10. The radiofrequency signal filter as recited in claim 3, wherein each of the corresponding planar inductors of the first and second selected reject band non-radiofrequency-coupling tiles has a spiral shape.

11. The radiofrequency signal filter as recited in claim 10, wherein each of the corresponding planar inductors of the first and second selected reject band non-radiofrequency-coupling tiles has a either a hexagonal spiral shape, an octagonal spiral shape, a circular spiral shape, a rectangular spiral shape, a triangular spiral shape, or a square spiral shape.

12. The radiofrequency signal filter as recited in claim 10, wherein each of the corresponding planar inductors of the first and second selected reject band non-radiofrequency-coupling tiles has a substantially rectangular vertical cross-section shape defined by a width and a height, the width measured parallel to the corresponding printed circuit board, the height measured perpendicular to the corresponding printed circuit board, wherein the width is within a range extending from about 0.1 millimeter to about 10 millimeters, and the height is within a range extending from about 0.05 millimeter to about 3 millimeters.

13. The radiofrequency signal filter as recited in claim 10, wherein each of the corresponding planar inductors of the first and second selected reject band non-radiofrequency-coupling tiles includes a number of turns within a range extending from about 2 turns to about 50 turns.

14. The radiofrequency signal filter as recited in claim 13, wherein each of the corresponding planar inductors of the first and second selected reject band non-radiofrequency-coupling tiles has a spacing between adjacent turns as measured parallel to the corresponding printed circuit board within a range extending from about 0.1 millimeter to about 5 millimeters.

15. The radiofrequency signal filter as recited in claim 10, wherein each of the corresponding planar inductors of the first and second selected reject band non-radiofrequency-coupling tiles has a square spiral shape.

16. The radiofrequency signal filter as recited in claim 3, wherein the corresponding planar inductor of the first selected reject band non-radiofrequency-coupling tile is shaped and sized to prevent coupling of radiofrequency signals within a particular radiofrequency band to the corresponding ground plate of the first selected reject band non-radiofrequency-coupling tile, and wherein the corresponding planar inductor of the second selected reject band non-radiofrequency-coupling tile is shaped and sized to prevent coupling of radiofrequency signals within a particular radiofrequency band to the corresponding ground plate of the second selected reject band non-radiofrequency-coupling tile.

17. The radiofrequency signal filter as recited in claim 3, wherein the corresponding ground plate, the corresponding planar inductor, and the corresponding conductive via structure of the first selected reject band non-radiofrequency-coupling tile are formed of copper, and wherein the corresponding printed circuit board of the first selected reject band non-radiofrequency-coupling tile is formed of FR-4 glass epoxy, wherein the corresponding ground plate, the corresponding planar inductor, and the corresponding conductive via structure of the second selected reject band non-radiofrequency-coupling tile are formed of copper, and wherein the corresponding printed circuit board of the second selected reject band non-radiofrequency-coupling tile is formed of FR-4 glass epoxy.

18. The radiofrequency signal filter as recited in claim 3, wherein an area percentage of the corresponding ground plate of the first selected reject band non-radiofrequency-coupling tile that is overlapped by the corresponding planar inductor of the first selected reject band non-radiofrequency-coupling tile is within a range extending from about 30% to about 100%, and wherein an area percentage of the corresponding ground plate of the second selected reject band non-radiofrequency-coupling tile that is overlapped by the corresponding planar inductor of the second selected reject band non-radiofrequency-coupling tile is within a range extending from about 30% to about 100%.

19. The radiofrequency signal filter as recited in claim 3, wherein a thickness of the corresponding printed circuit board of the first selected reject band non-radiofrequency-coupling tile is within a range extending from about 1 millimeter to about 6 millimeters, and wherein a thickness of the corresponding printed circuit board of the second selected reject band non-radiofrequency-coupling tile is within a range extending from about 1 millimeter to about 6 millimeters.

\* \* \* \* \*